(12) United States Patent
Yoo et al.

(10) Patent No.: US 11,658,075 B2
(45) Date of Patent: May 23, 2023

(54) SEMICONDUCTOR DEVICE

(71) Applicant: SAMSUNG ELECTRONICS CO., LTD., Suwon-si (KR)

(72) Inventors: Sangmin Yoo, Suwon-si (KR); Juyoun Kim, Suwon-si (KR); Hyungjoo Na, Seoul (KR); Bongseok Suh, Seoul (KR); Jooho Jung, Suwon-si (KR); Euichul Hwang, Seoul (KR); Sungmoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/246,778

(22) Filed: May 3, 2021

(65) Prior Publication Data

US 2021/0257264 A1    Aug. 19, 2021

Related U.S. Application Data

(63) Continuation of application No. 16/408,912, filed on May 10, 2019, now Pat. No. 11,062,961.

(30) Foreign Application Priority Data

Oct. 1, 2018 (KR) .......................... 10-2018-0117040

(51) Int. Cl.
*H01L 27/088* (2006.01)
*H01L 21/8234* (2006.01)
(Continued)

(52) U.S. Cl.
CPC ............... *H01L 21/823878* (2013.01); *H01L 21/76224* (2013.01); *H01L 27/11807* (2013.01);
(Continued)

(58) Field of Classification Search
CPC ............. H01L 27/0886; H01L 29/7851; H01L 29/66553; H01L 21/265
See application file for complete search history.

(56) References Cited

U.S. PATENT DOCUMENTS 8,735,991 B2    5/2014    Shieh et al.
9,362,181 B1    6/2016    Xie et al.
(Continued)

FOREIGN PATENT DOCUMENTS

KR    10-2007-0040958    4/2007
KR    10-2016-0010262    1/2016
(Continued)

*Primary Examiner* — Brian Turner
(74) *Attorney, Agent, or Firm* — F. Chau & Associates, LLC

(57) ABSTRACT

A semiconductor device is provided. The semiconductor device includes a substrate including an active pattern, a gate electrode extending in a first direction and crossing the active pattern which extends in a second direction, a separation structure crossing the active pattern and extending in the first direction, a first gate dielectric pattern disposed on a side surface of the gate electrode, a second gate dielectric pattern disposed on a side surface of the separation structure, and a gate capping pattern covering a top surface of the gate electrode. A level of a top surface of the separation structure is higher than a level of a top surface of the gate capping pattern.

20 Claims, 32 Drawing Sheets

(51) Int. Cl.
  *H01L 23/522* (2006.01)
  *H01L 29/06* (2006.01)
  *H01L 21/311* (2006.01)
  *H01L 21/8238* (2006.01)
  *H01L 27/118* (2006.01)
  *H01L 21/762* (2006.01)

(52) U.S. Cl.
  CPC .............. *H01L 2027/11816* (2013.01); *H01L 2027/11829* (2013.01); *H01L 2027/11861* (2013.01)

(56) References Cited

U.S. PATENT DOCUMENTS

| | | | |
|---|---|---|---|
| 9,466,696 B2 | 10/2016 | Mor et al. | |
| 9,614,035 B2 | 4/2017 | Kim et al. | |
| 9,831,248 B1 | 11/2017 | Zang et al. | |
| 9,905,468 B2 | 2/2018 | Kim et al. | |
| 10,366,927 B2 | 7/2019 | Lee et al. | |
| 11,264,385 B2 | 3/2022 | Liaw | |
| 2013/0307040 A1 | 11/2013 | Ahn et al. | |
| 2014/0246707 A1 | 9/2014 | Koo et al. | |
| 2015/0372036 A1 | 12/2015 | Suh et al. | |
| 2016/0163604 A1 | 6/2016 | Xie et al. | |
| 2016/0268414 A1 | 9/2016 | Park et al. | |
| 2016/0300949 A1* | 10/2016 | Lee | H01L 29/66636 |
| 2016/0307890 A1 | 10/2016 | Yeo et al. | |
| 2016/0336234 A1* | 11/2016 | Kim | H01L 21/823431 |
| 2017/0287933 A1* | 10/2017 | Chen | H01L 27/0207 |
| 2017/0365674 A1 | 12/2017 | Lee et al. | |
| 2018/0040694 A1* | 2/2018 | Tseng | H01L 29/66795 |
| 2018/0047636 A1 | 2/2018 | You et al. | |
| 2018/0047848 A1* | 2/2018 | Liou | H01L 29/0653 |
| 2019/0109045 A1 | 4/2019 | Xie et al. | |
| 2019/0172753 A1 | 6/2019 | Lin et al. | |
| 2019/0334035 A1* | 10/2019 | Chang | H01L 21/823437 |
| 2020/0013678 A1 | 1/2020 | Gu et al. | |
| 2020/0066895 A1* | 2/2020 | Cheng | H01L 27/0886 |
| 2020/0105625 A1 | 4/2020 | Yoo et al. | |

FOREIGN PATENT DOCUMENTS

| | | |
|---|---|---|
| KR | 10-2016-0122910 | 10/2016 |
| KR | 10-2017-0085177 | 7/2017 |

* cited by examiner

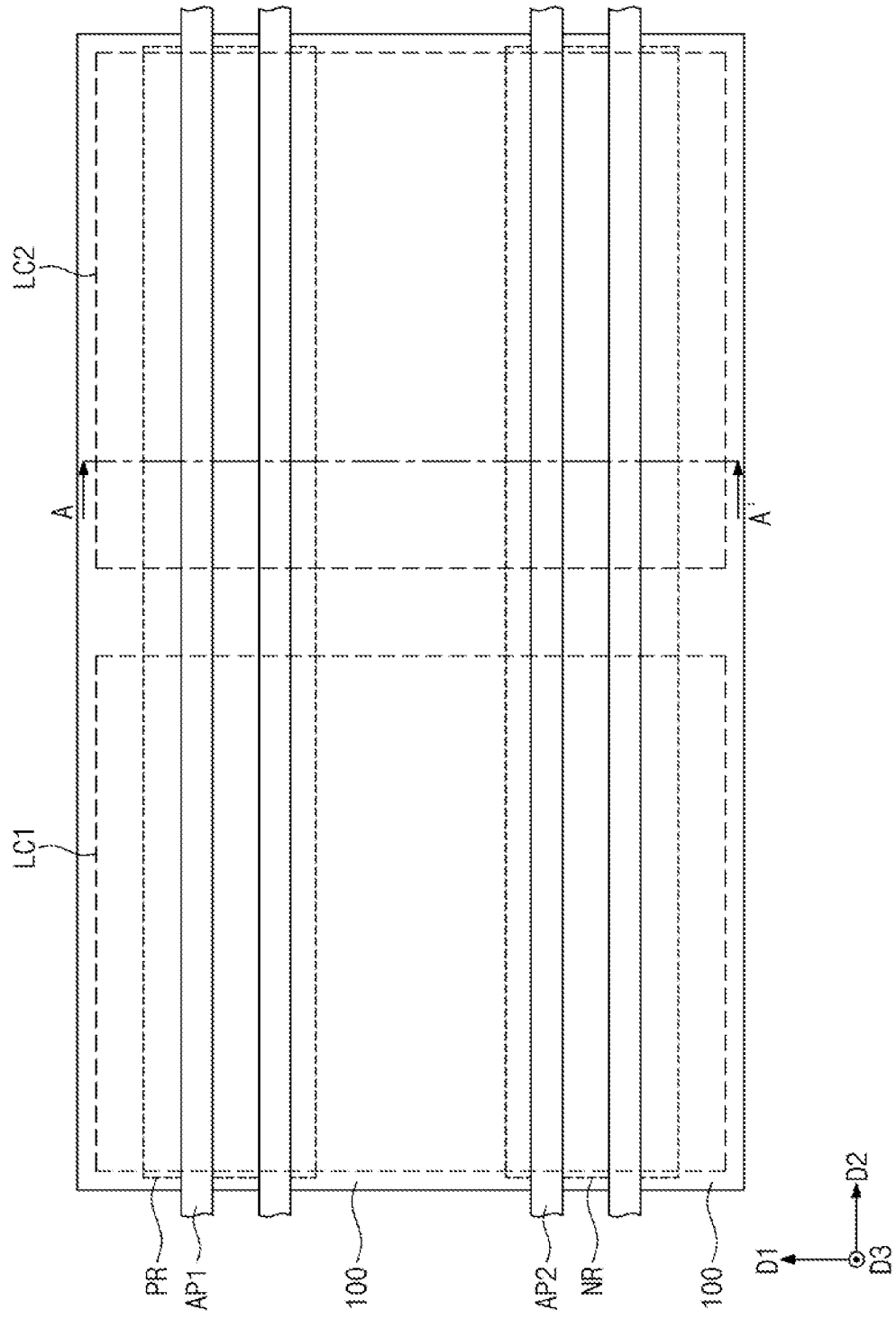

US 11,658,075 B2

SEMICONDUCTOR DEVICE

CROSS-REFERENCE TO RELATED APPLICATIONS

This U.S. non-provisional patent application is a continuation of U.S. application Ser. No. 16/408,912, filed on May 10, 2019, which claims priority under 35 U.S.C. § 119 to Korean Patent Application No. 10-2018-0117040, filed on Oct. 1, 2018, in the Korean Intellectual Property Office, the entire contents of which are herein incorporated by reference.

TECHNICAL FIELD

The present inventive concept relates to a semiconductor device, and more particularly, to a semiconductor device including a field effect transistor.

DISCUSSION OF RELATED ART

Due to their small-size, multifunctionality, and/or low fabrication cost, semiconductor devices have been widely used in the electronic industry. The semiconductor devices may be classified into a memory device for storing data, a logic device for processing data, and a hybrid device including both memory and logic elements. To meet the increased demand for electronic devices with fast speed and/or low power consumption, the semiconductor devices may require high reliability, high performance, and/or multiple functions. To satisfy these requirements, complexity and/or integration density of the semiconductor devices are being increased.

SUMMARY

Example embodiments of the present inventive concept provide a semiconductor device including a field effect transistor with enhanced electrical and reliability characteristics.

According to an example embodiment of the present inventive concept, a semiconductor device includes a substrate including an active pattern, a gate electrode extending in a first direction and crossing the active pattern which extends in a second direction, a separation structure crossing the active pattern and extending in the first direction, a first gate dielectric pattern disposed on a side surface of the gate electrode, a second gate dielectric pattern disposed on a side surface of the separation structure, and a gate capping pattern covering a top surface of the gate electrode. A level of a top surface of the separation structure may be higher than a level of a top surface of the gate capping pattern.

According to an example embodiment of the present inventive concept, a semiconductor device includes a substrate including an active pattern extending in a first direction, a separation structure crossing the active pattern and extending in a second direction crossing the first direction, a first gate spacer disposed on a side surface of the separation structure, and a first gate dielectric pattern interposed between the separation structure and the first gate spacer. A level of a top surface of the separation structure may be higher than a level of a top surface of the first gate spacer.

According to an example embodiment of the present inventive concept, a semiconductor device includes a substrate including an active pattern, gate electrodes crossing the active pattern, an interlayer insulating layer disposed on the gate electrodes, a separation structure extending vertically from a top surface of the interlayer insulating layer toward a bottom surface of the substrate, the separation structure penetrating an upper portion of the active pattern, and a first gate dielectric pattern disposed on a side surface of the separation structure.

BRIEF DESCRIPTION OF THE DRAWINGS

Example embodiments of the present inventive concept will be more clearly understood from the following detailed description taken in conjunction with the accompanying drawings, in which:

FIGS. 3, 5, 7, 9, and 11 are plan views illustrating a method of fabricating a semiconductor device, according to an example embodiment of the present inventive concept;

Figure 1:
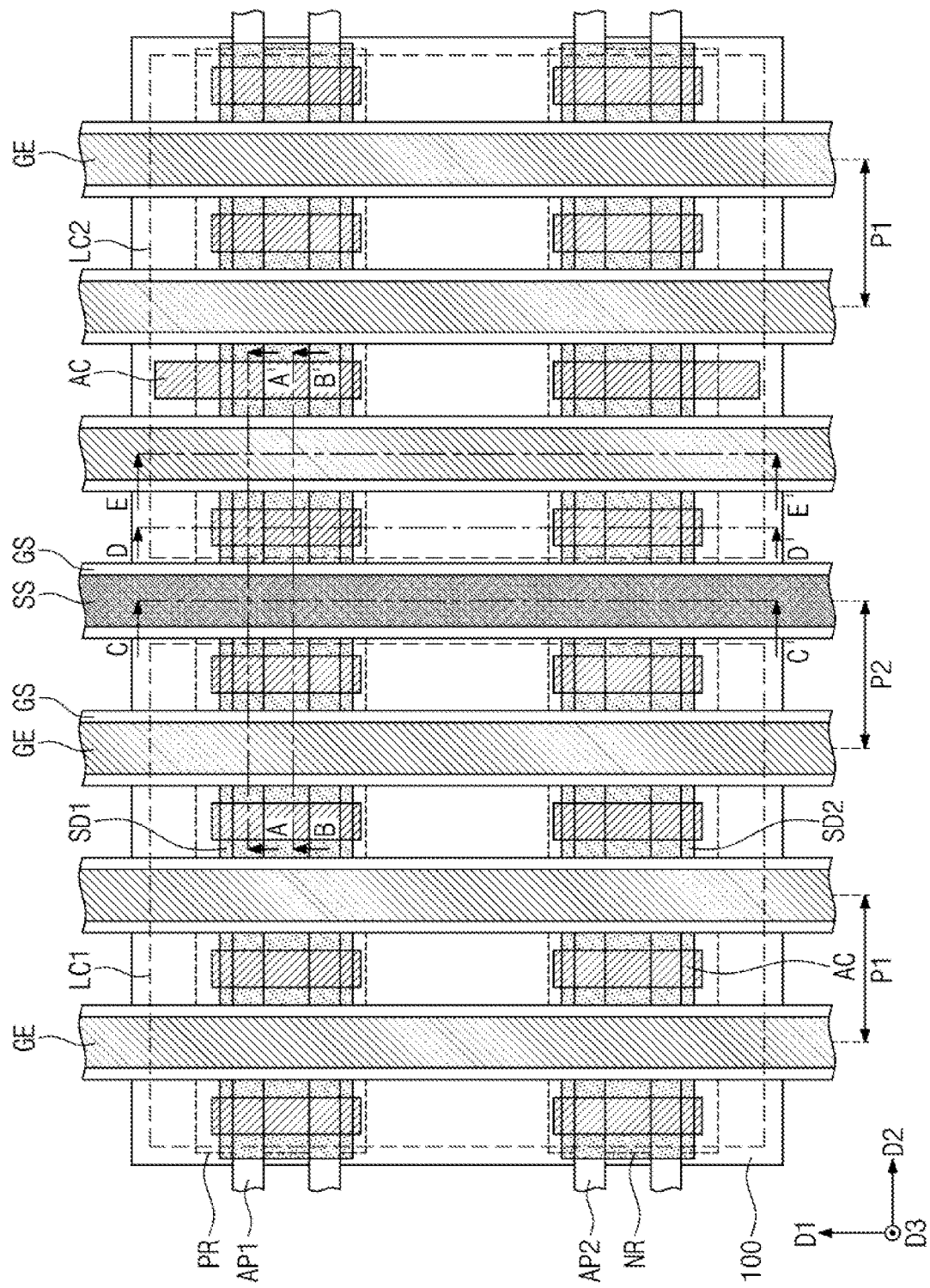
FIG. 1 is a plan view illustrating a semiconductor device according to an example embodiment of the present inventive concept.

Since the drawings in FIGS. 1-15B are intended for illustrative purposes, the elements in the drawings are not necessarily drawn to scale. For example, some of the elements may be enlarged or exaggerated for clarity purpose. The use of similar or identical reference numbers in the various drawings is intended to indicate the presence of a similar or identical element or feature.

DETAILED DESCRIPTION OF THE EMBODIMENTS

Example embodiments of the present inventive concept will now be described more fully with reference to the accompanying drawings, in which example embodiments are shown.

FIG. 1 is a plan view illustrating a semiconductor device according to an example embodiment of the present inventive concept. FIGS. 2A to 2E are cross-sectional views taken along lines A-A', B-B', C-C', D-D' and E-E', respectively, of FIG. 1.

Referring to FIGS. 1 and 2A to 2E, a first logic cell LC1 and a second logic cell LC2 may be provided and arranged in a second direction D2. Each of the first and second logic cells LC1 and LC2 may constitute a logic circuit (e.g., AND, OR, NAND, NOR, XOR, XNOR, or inverter). Logic transistors constituting the logic circuit may be provided in each of the first and second logic cells LC1 and LC2. The logic transistor may be a fin-type field-effect transistor (FinFET). The first and second logic cells LC1 and LC2 may include the same logic circuit or different logic circuits. Hereinafter, the structures of the first and second logic cells LC1 and LC2 will be described in more detail.

A substrate 100 including a p-type metal-oxide semiconductor field-effect transistor (PMOSFET) region PR and an n-type metal-oxide semiconductor field-effect transistor (NMOSFET) region NR may be provided. The substrate 100 may be a semiconductor substrate (e.g., of silicon (Si), germanium (Ge), or silicon-germanium (SiGe)) or a compound semiconductor substrate (e.g., of gallium phosphide (GaP), gallium arsenide (GaAs), gallium antimonide (GaSb), indium phosphide (InP), indium arsenide (InAs), indium antimonide (InSb), or indium gallium arsenide (InGaAs)). In an example embodiment of the present inventive concept, the substrate 100 may be a silicon wafer.

A second trench TR2 may be provided in an upper portion of the substrate 100 to define the PMOSFET region PR and the NMOSFET region NR, and may be located between the PMOSFET and NMOSFET regions PR and NR. The PMOSFET region PR and the NMOSFET region NR may be spaced apart from each other, in a first direction D1, with the second trench TR2 interposed therebetween. Each of the PMOSFET and NMOSFET regions PR and NR may extend in the second direction D2 crossing the first direction D1, and may extend to cross the first and second logic cells LC1 and LC2.

A plurality of active patterns AP1 and AP2 extending in the second direction D2 may be provided on the PMOSFET and NMOSFET regions PR and NR. The active patterns AP1 and AP2 may include first active patterns AP1 on the PMOSFET region PR and second active patterns AP2 on the NMOSFET region NR. Each of the first and second active patterns AP1 and AP2, which have a vertically protruding shape, may be a portion of the substrate 100. A first trench TR1 may be provided between adjacent ones of the first active patterns AP1 to define the first active patterns AP1, and provided between adjacent ones of the second active patterns AP2 to define the second active patterns AP2. The first trench TR1 may be shallower than the second trench TR2. For example, a level of a bottom of the first trench TR1 may be higher than a level of a bottom of the second trench TR2. For example, in comparison to the bottom of the first trench TR1, the bottom of the second trench TR2 is closer to a bottom surface of the substrate 100.

A device isolation layer ST may be provided to fill the first and second trenches TR1 and TR2. Thus, the device isolation layer ST may fill the first trench TR1 to define the first and second active patterns AP1 and AP2, and may fill the second trench TR2 to define the PMOSFET region PR and the NMOSFET region NR. The device isolation layer ST may be formed of or include at least one of insulating materials (e.g., silicon oxide ($SiO_2$)). Each of the upper portions of the first and second active patterns AP1 and AP2 may have a shape vertically protruding above the device isolation layer ST. For example, each of the upper portions of the first and second active patterns AP1 and AP2 may have a fin shape. The device isolation layer ST may not cover the upper portions of the first and second active patterns AP1 and AP2, and may cover lower side surfaces of the first and second active patterns AP1 and AP2.

First source/drain patterns SD1 may be provided on the upper portions of the first active patterns AP1, and may be impurity regions of a first conductivity type (e.g., p-type). A first channel region CH1 may be interposed between each pair of the first source/drain patterns SD1. Second source/drain patterns SD2 may be provided on the upper portions of the second active patterns AP2, and may be impurity regions of a second conductivity type (e.g., n-type). A second channel region CH2 may be interposed between each pair of the second source/drain patterns SD2. The first channel region CH1 may be the upper portion of each of the first active patterns AP1 vertically protruding above the device isolation layer ST, and the second channel region CH2 may be the upper portion of each of the second active patterns AP2 vertically protruding above the device isolation layer ST.

Figure 2A:
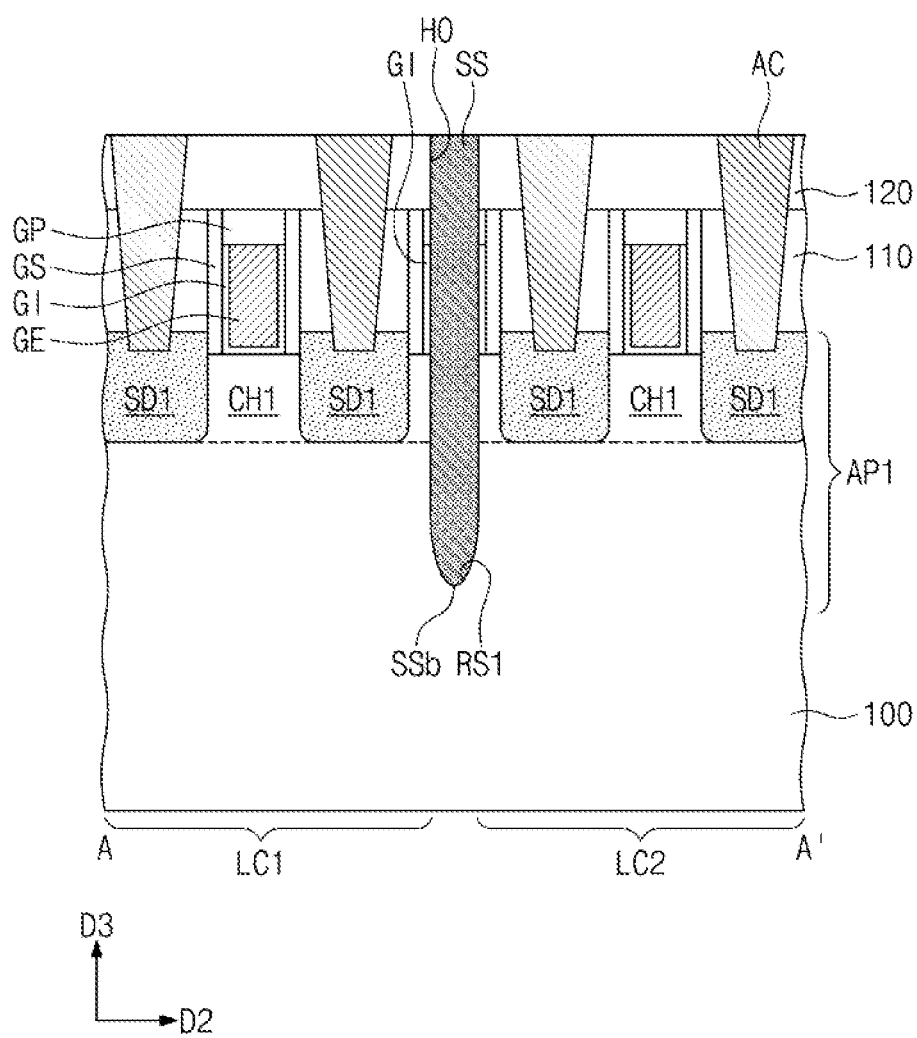
FIGS. 2A to 2E are cross-sectional views taken along lines A-A', B-B', C-C', D-D' and E-E', respectively, of FIG. 1.
Figure 2B:
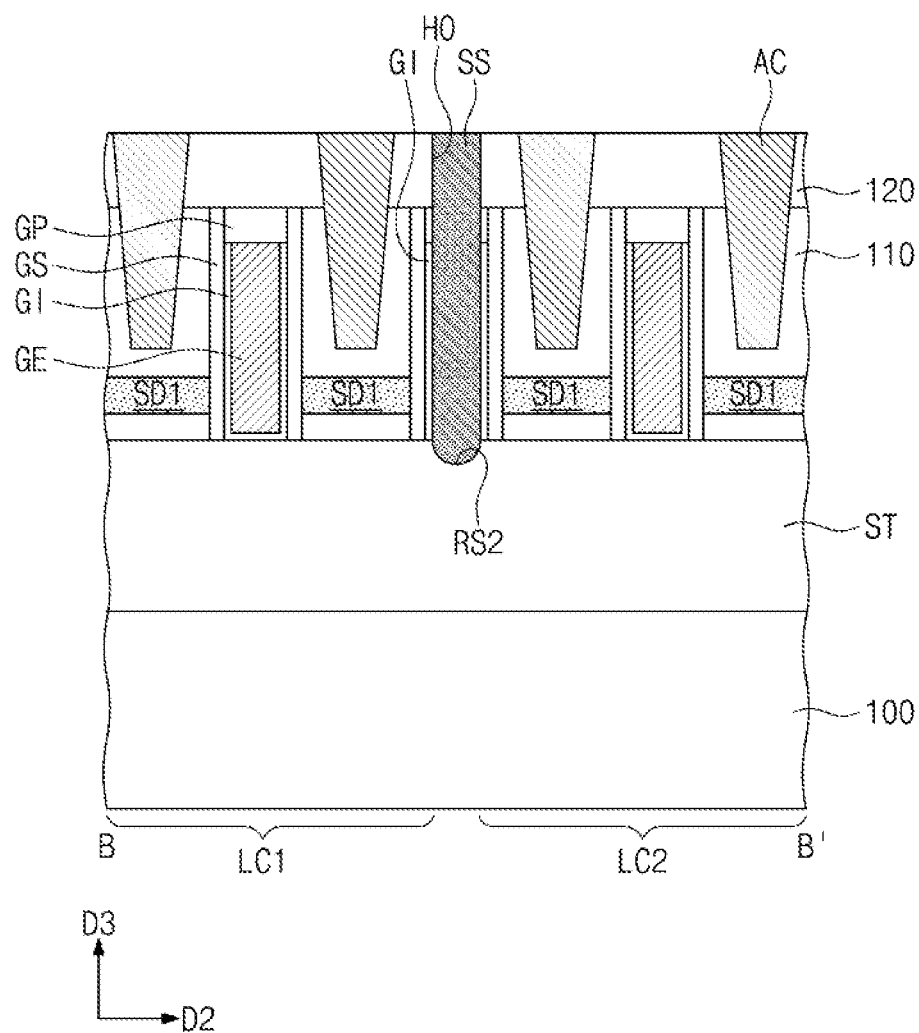
Figure 2C:
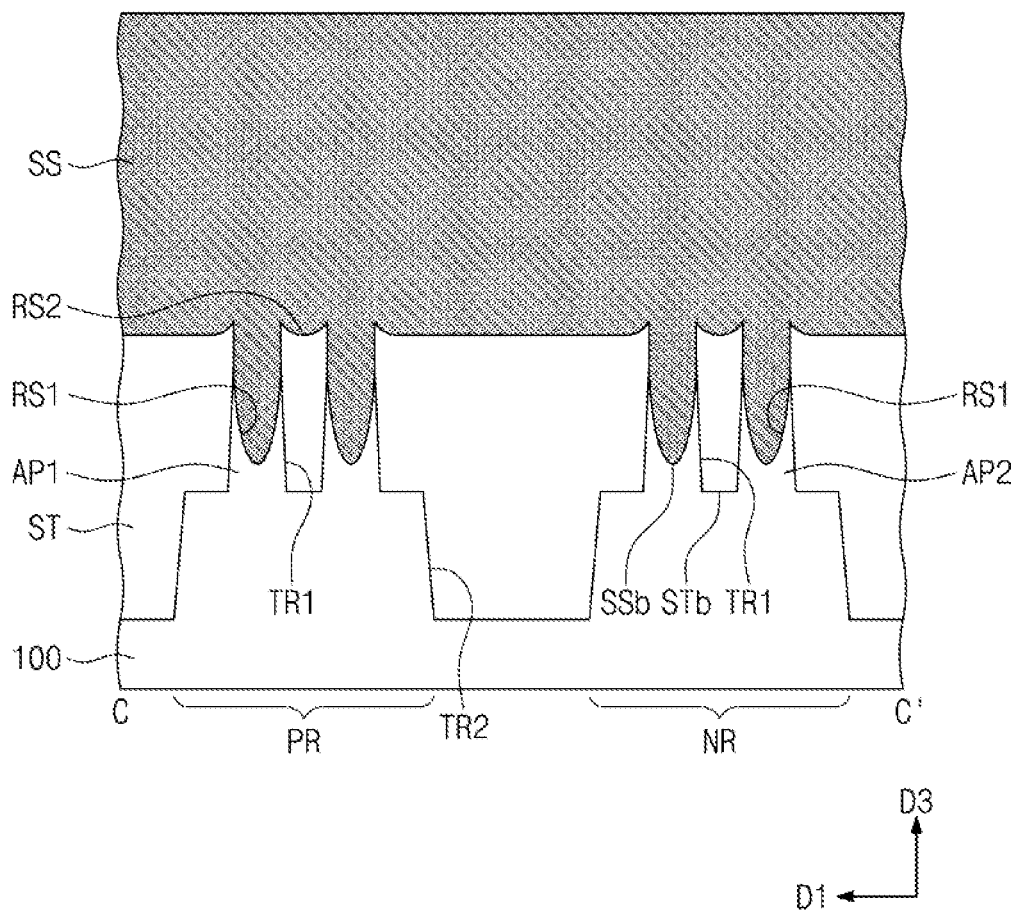
Figure 2D:
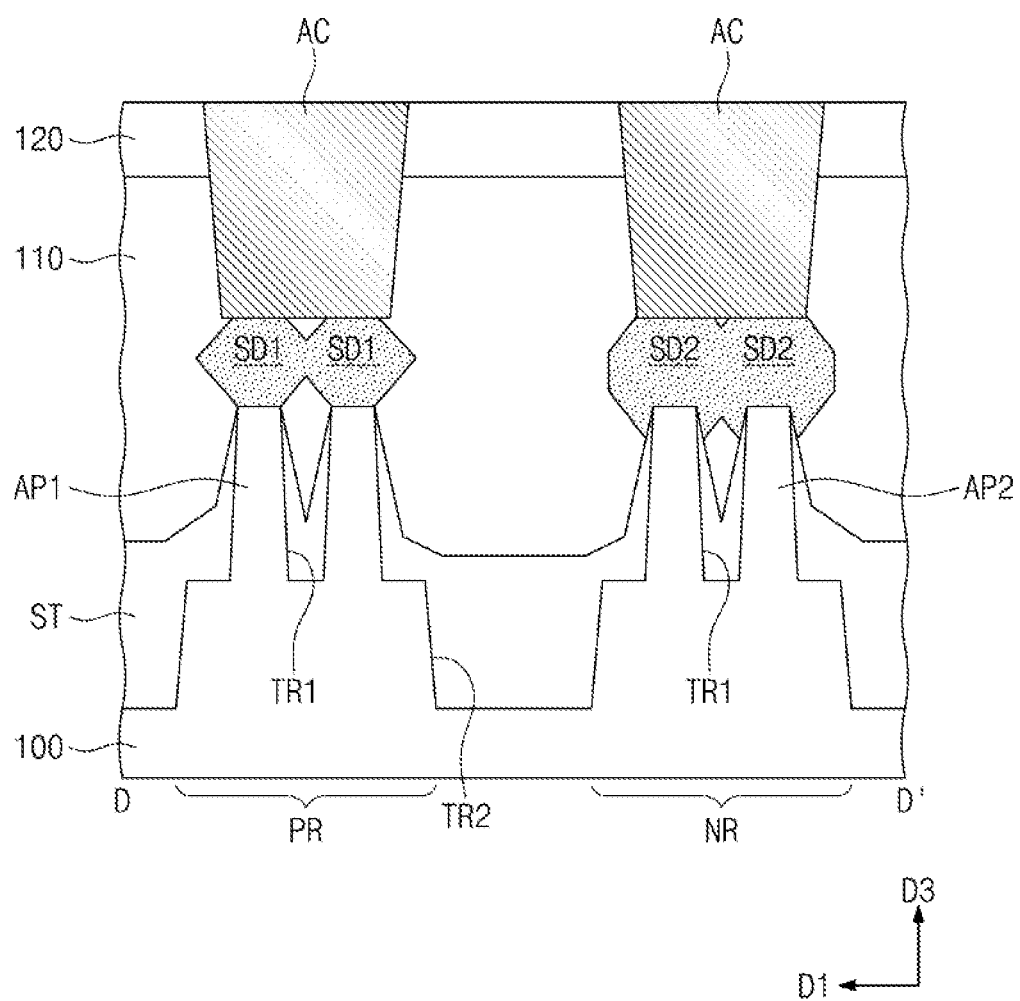
Figure 2E:
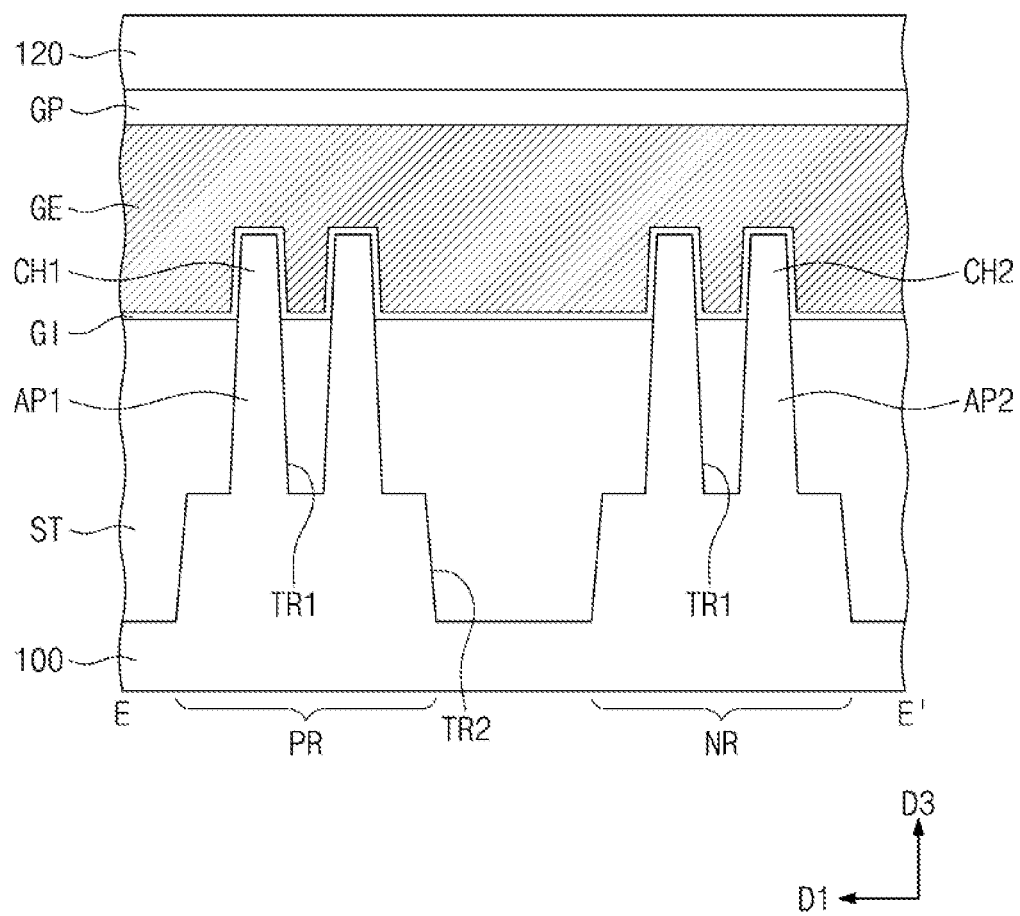

The first and second source/drain patterns SD1 and SD2 may be epitaxial patterns that are formed by a selective epitaxial growth process. In an example embodiment of the present inventive concept, two or more adjacent first and second source/drain patterns SD1 and SD2 may be merged with one another in the selective epitaxial growth process. The first and second source/drain patterns SD1 and SD2 may have top surfaces that are positioned at a level higher than those of the first and second channel regions CH1 and CH2. In an example embodiment of the present inventive concept, the first source/drain patterns SD1 may include a semiconductor material (e.g., SiGe) having a lattice constant greater than that of the semiconductor substrate 100. In this case, the first source/drain patterns SD1 may exert a compressive stress to the first channel regions CH1. In an example embodiment of the present inventive concept, the second source/drain patterns SD2 may include the same semiconductor material (e.g., Si) as that of the substrate 100. As illustrated in FIG. 2D, the first and second source/drain patterns SD1 and SD2 may have a pentagonal or hexagonal shape, but the present inventive concept is not limited thereto, and the first and second source/drain patterns SD1 and SD2 may have various shapes.

Gate electrodes GE may be provided to cross the first and second active patterns AP1 and AP2 and to extend in the first direction D1, and may be spaced apart from each other in the second direction D2. A pitch between adjacent ones of the gate electrodes GE may be a first pitch P1. In the present specification, the term "pitch" refers to a distance between centers of first and second patterns adjacent to each other.

The gate electrodes GE may vertically overlap the first and second channel regions CH1 and CH2. Each of the gate electrodes GE may be provided to cover a top surface and opposite side surfaces of a corresponding one of the first and second channel regions CH1 and CH2 and an upper surface of the device isolation layer ST (e.g., see FIG. 2E). In an example embodiment of the present inventive concept, the gate electrodes GE may be formed of or include at least one of conductive metal nitrides (e.g., titanium nitride (TiN), tantalum nitride (TaN), or tungsten nitride (WN)) or metallic materials (e.g., titanium (Ti), tantalum (Ta), tungsten (W), copper (Cu), molybdenum (Mo) or aluminum (Al)).

A pair of the gate spacers GS may be respectively provided on the opposite sidewalls of each of the gate electrodes GE. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of, for example, silicon carbonitride (SiCN), silicon carbon oxynitride (SiCON), or silicon nitride ($Si_3N_4$). In an example embodiment of the present inventive concept, the gate spacers GS may include a multi-layered structure that is made of at least two layers of silicon carbonitride (SiCN), silicon carbon oxynitride (SiCON), and silicon nitride ($Si_3N_4$) layers.

Gate dielectric patterns GI may be interposed between the gate electrodes GE and the first and second active patterns AP1 and AP2. Each of the gate dielectric patterns GI may extend along a bottom surface of a corresponding one of the gate electrodes GE, and thus may also be interposed between the device isolation layer ST and the corresponding one of the gate electrodes GE. Each of the gate dielectric patterns GI may cover the top surface and the opposite side surfaces of a corresponding one of the first and second channel regions CH1 and CH2. The gate dielectric patterns GI may be formed of or include a high-k dielectric material which may have a dielectric constant higher than that of the silicon oxide ($SiO_2$). For example, the high-k dielectric material may be formed of or include at least one of, for example, hafnium oxide ($HfO_2$), hafnium silicon oxide ($HfSiO_4$), lanthanum oxide ($La_2O_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), or lead zinc niobate ($Pb(Zn_{1/3}Nb_{2/3})O_3$).

A gate capping pattern GP may be provided on each of the gate electrodes GE. The gate capping patterns GP may extend along the gate electrodes GE in the first direction D1. The gate capping patterns GP may be formed of or include at least one of materials, which are selected to have an etch selectivity with respect to first and second interlayer insulating layers 110 and 120 to be described below. For example, the gate capping patterns GP may be formed of or include at least one of, for example, silicon oxynitride (SiON), silicon carbonitride (SiCN), silicon carbon oxynitride (SiCON), or silicon nitride ($Si_3N_4$).

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. The second interlayer insulating layer 120 may be provided on the first interlayer insulating layer 110 to cover the gate capping patterns GP. In an example embodiment of the present inventive concept, the first and second interlayer insulating layers 110 and 120 may be formed of or include silicon oxide ($SiO_2$). For example, in an example embodiment of the present inventive concept, the first interlayer insulating layer 110 and second interlayer insulating layer 120 may be implemented as a single interlayer insulating layer covering the gate spacers GS, the gate capping patterns GP and the first and second source/drain patterns SD1 and SD2. However, the present inventive concept is not limited thereto. For example, the first and second interlayer insulating layers 110 and 120 may be formed of or include different insulating materials.

Active contacts AC may be formed to penetrate the first and second interlayer insulating layers 110 and 120 and to be electrically connected to the first and second source/drain patterns SD1 and SD2. Thus, the active contacts AC may also be electrically connected to the first and second active patterns AP1 and AP2 through the first and second source/drain patterns SD1 and SD2. The active contacts AC may be surrounded by the first and second interlayer insulating layers 110 and 120 to be insulated from each other and from other conductive elements. The active contacts AC may extend vertically in a third direction D3. The active contacts AC may be formed of or include at least one of metallic materials (e.g., aluminum (Al), copper (Cu), tungsten (W), molybdenum (Mo), and cobalt (Co)).

A separation structure SS may be provided on a cell boundary between the first and second logic cells LC1 and LC2. The separation structure SS may extend in the first direction D1 and may separate adjacent ones of the first and second logic cells LC1 and LC2 from each other. The separation structure SS may extend in the first direction D1 to cross the PMOSFET and NMOSFET regions PR and NR.

On the PMOSFET region PR, the separation structure SS may extend in the first direction D1 and may cross the upper portions of the first active patterns AP1. The first active pattern AP1 of the first logic cell LC1 may be electrically disconnected from the first active pattern AP1 of the second logic cell LC2 by the separation structure SS. For example, the separation structure SS may be formed to separate the first active pattern AP1 of the first logic cell LC1 from the first active pattern AP1 of the second logic cell LC2. On the NMOSFET region NR, the separation structure SS may extend in the first direction D1 and may cross the upper portions of the second active patterns AP2. The second active pattern AP2 of the first logic cell LC1 may be electrically disconnected from the second active pattern AP2 of the second logic cell LC2 by the separation structure SS. For example, the separation structure SS may be formed to separate the second active pattern AP2 of the first logic cell LC1 from the second active pattern AP2 of the second logic cell LC2.

A hole HO may be formed to penetrate the second interlayer insulating layer 120, a gate capping pattern GP, a gate electrode GE and a gate dielectric pattern GI. The hole HO may be positioned between the first and second logic cells LC1 and LC2. The separation structure SS may fill the hole HO.

A first recess RS1 may be formed in each of the upper portions of the first active patterns AP1 between the first and second logic cells LC1 and LC2. The first recess RS1 may also be formed in each of the upper portions of the second active patterns AP2 between the first and second logic cells LC1 and LC2. For example, the first recess RS1 may be formed by extending the hole HO into each of the upper portions of the first active patterns AP1 between the first and second logic cells LC1 and LC2, or extending the hole HO into each of the upper portions of the second active patterns AP2 between the first and second logic cells LC1 and LC2. A second recess RS2 may be formed in an upper portion of the device isolation layer ST between the first and second logic cells LC1 and LC2. For example, the second recess RS1 may be formed by extending the hole HO into the upper portion of the device isolation layer ST between the first and second logic cells LC1 and LC2. The separation structure SS may fill not only the hole HO but also the first and second recesses RS1 and RS2 formed below the hole HO. In other words, the separation structure SS may extend toward a bottom surface of the substrate 100 to penetrate the upper portions of the first and second active patterns AP1 and AP2.

The first recess RS1 may be deeper than the second recess RS2. The first recess RS1 may be shallower than the first trench TR1. In other words, a level of a bottom SSb of the separation structure SS penetrating the upper portions of the first and second active patterns AP1 and AP2 may be higher than a level of a bottom STb of the device isolation layer ST filling the first trench TR1. However, the present inventive concept is not limited thereto. For example, in an example embodiment of the present inventive concept, the first recess RS1 may be deeper than the first trench TR1. For example, in an example embodiment of the present inventive concept, the first recess RS1 may be deeper than the second trench TR2.

The separation structure SS may be provided between the gate electrode GE of the first logic cell LC1 and the gate electrode GE of the second logic cell LC2. The gate electrode GE of the first logic cell LC1, the separation structure SS, and the gate electrode GE of the second logic cell LC2 may be arranged in the second direction D2. Also, the gate electrode GE of the first logic cell LC1, the separation structure SS, and the gate electrode GE of the second logic cell LC2 may extend in parallel with one another in the first direction D1. A pitch between the separation structure SS and the gate electrode GE adjacent thereto may be a second pitch P2. The second pitch P2 may be substantially equal to the first pitch P1 between adjacent ones of the gate electrodes GE. For example, except minor deviation due to process variation, the second pitch P2 may be equal to the first pitch P1.

A pair of the gate spacers GS may be provided on opposite side surfaces of the separation structure SS. When measured in the second direction D2, a width of the separation structure SS interposed between the pair of the gate spacers GS may be substantially equal to a width of the gate electrode GE interposed between the pair of the gate spacers GS.

The gate dielectric pattern GI may be interposed between the separation structure SS and the gate spacer GS. The gate dielectric pattern GI may have a vertically extending shape, between the separation structure SS and the gate spacer GS. The gate spacer GS on the separation structure SS may be formed of or include a material the same as that of the gate spacer GS on the gate electrode GE. The gate dielectric pattern GI on the separation structure SS may be formed of or include a material the same as that of the gate dielectric pattern GI on the gate electrode GE.

A level of a top surface of the separation structure SS may be higher than a level of the top surface of the gate capping pattern GP. Also, the level of the top surface of the separation structure SS may be higher than a level of a top surface of the gate spacer GS. The top surface of the separation structure SS may be substantially coplanar with the top surface of the second interlayer insulating layer 120 and the top surface of the active contact AC. The separation structure SS may be formed of or include at least one of, for example, silicon oxide ($SiO_2$), silicon nitride ($Si_3N_4$), or silicon oxynitride (SiON).

A plurality of interconnection layers may be stacked on the second interlayer insulating layer 120. The interconnection layers may constitute the logic circuits of the first and second logic cells LC1 and LC2. The interconnection layers may electrically connect the first and second logic cells LC1 and LC2 to other logic cells.

FIGS. 3, 5, 7, 9, and 11 are plan views illustrating a method of fabricating a semiconductor device, according to an example embodiment of the present inventive concept. FIGS. 4, 6A, 8A, 10A, and 12A are cross-sectional views taken along lines A-A' of FIGS. 3, 5, 7, 9, and 11, respectively. FIGS. 6B, 8B, 10B, and 12B are cross-sectional views taken along lines B-B' of FIGS. 5, 7, 9, and 11, respectively. FIGS. 6C, 8C, 10C, and 12C are cross-sectional views taken along lines C-C' of FIGS. 5, 7, 9, and 11, respectively. FIG. 12D is a cross-sectional view taken along line D-D' of FIG. 11. FIG. 12E is a cross-sectional view taken along line E-E' of FIG. 11.

Figure 4:
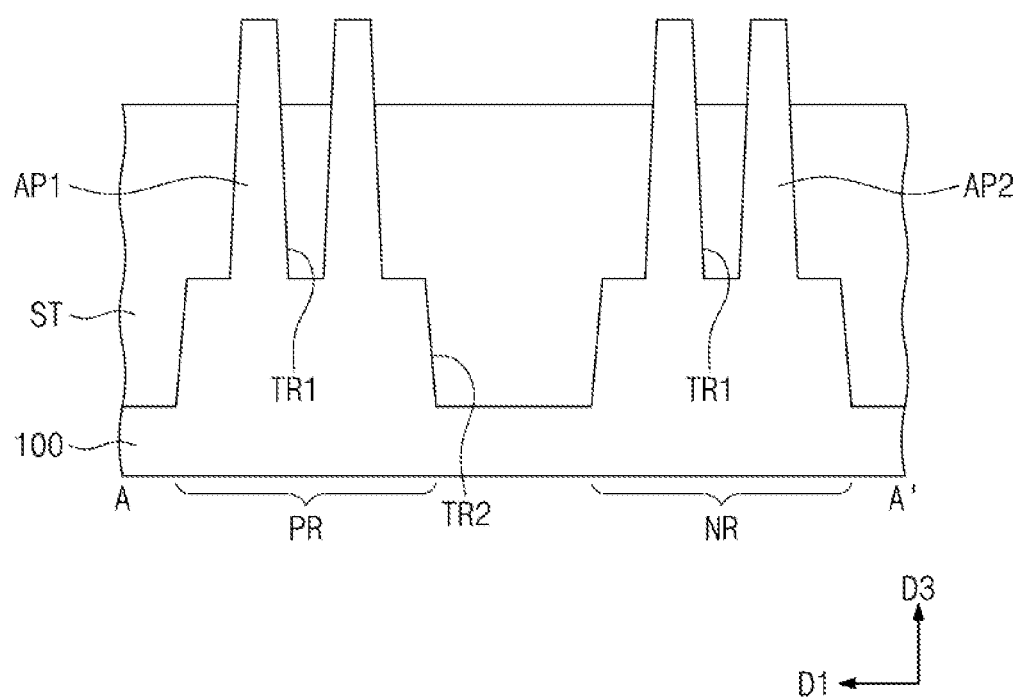
FIGS. 4, 6A, 8A, 10A, and 12A are cross-sectional views taken along lines A-A' of FIGS. 3, 5, 7, 9, and 11, respectively.
Figure 5:
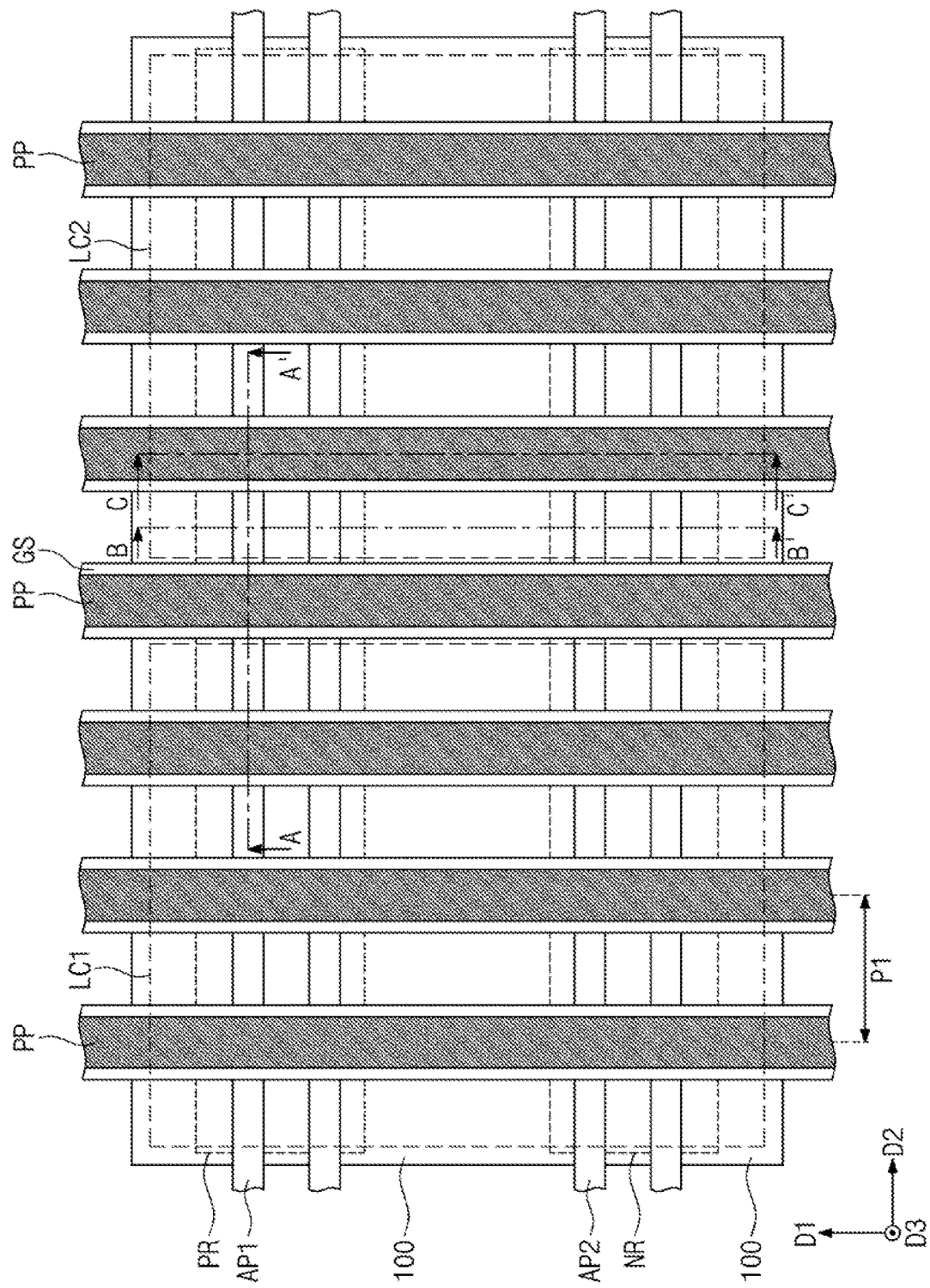
Figure 6A:
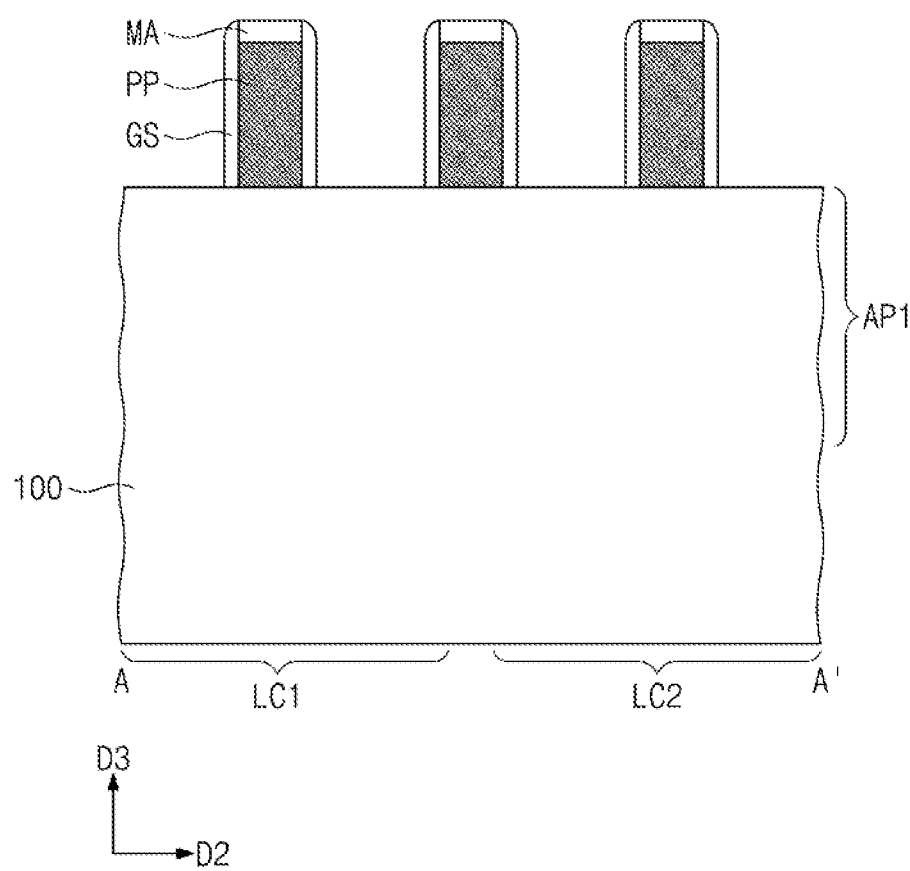
Figure 6B:
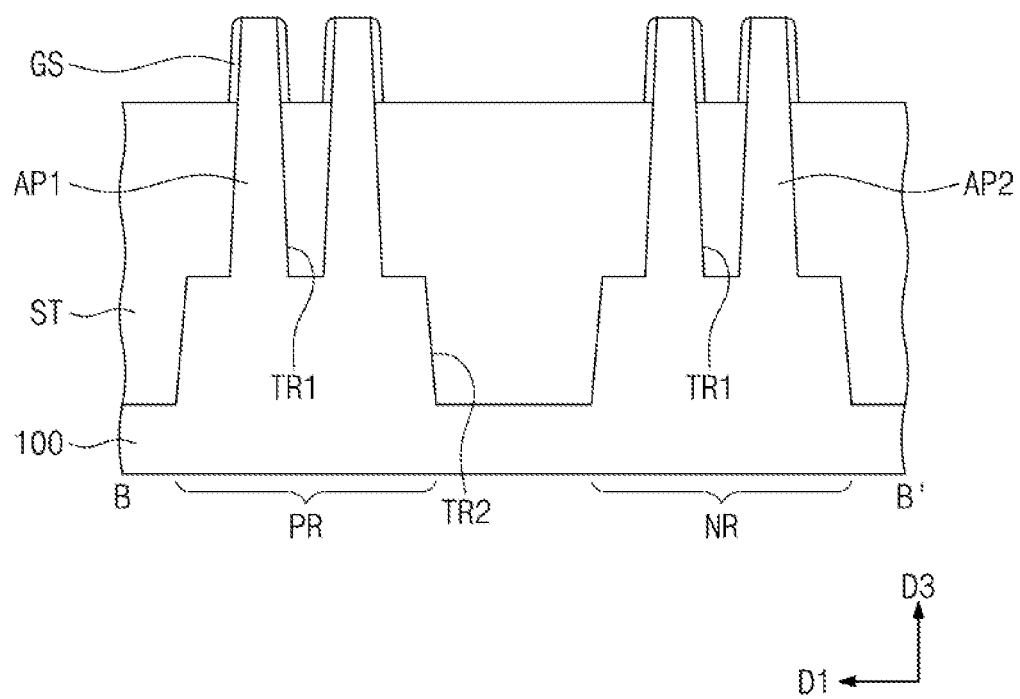
FIGS. 6B, 8B, 10B, and 12B are cross-sectional views taken along lines B-B' of FIGS. 5, 7, 9, and 11, respectively.
Figure 6C:
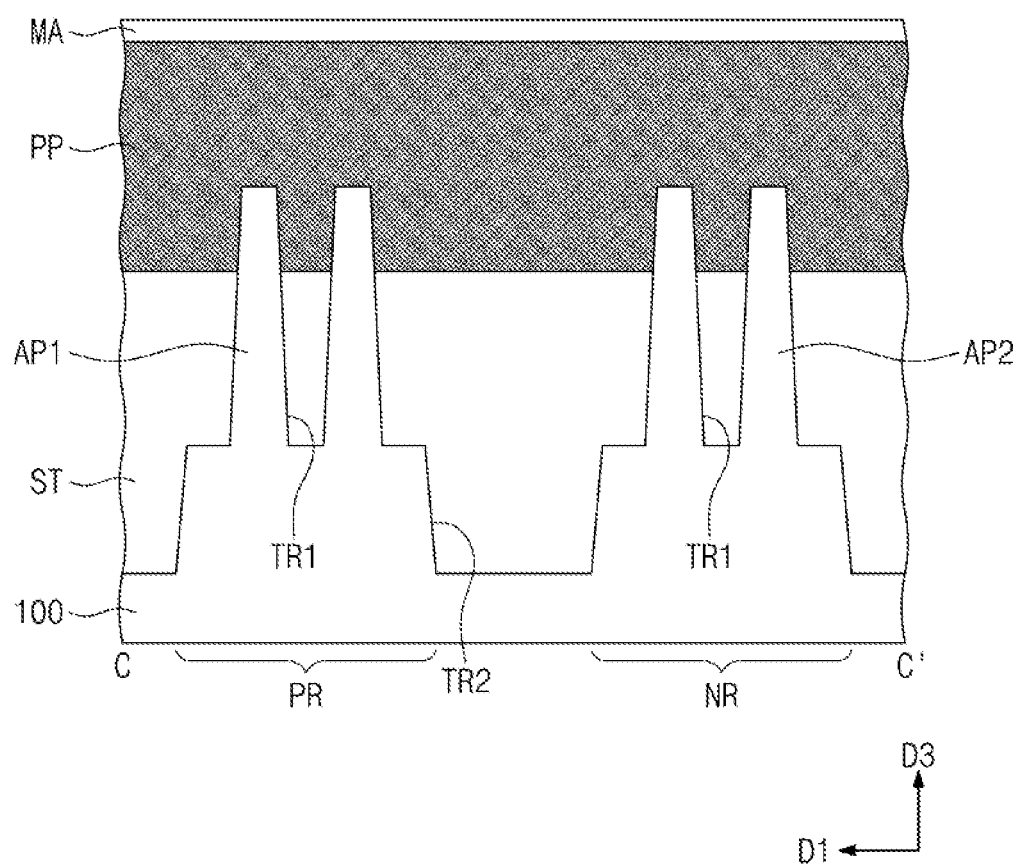
FIGS. 6C, 8C, 10C, and 12C are cross-sectional views taken along lines C-C' of FIGS. 5, 7, 9, and 11, respectively.
Figure 7:
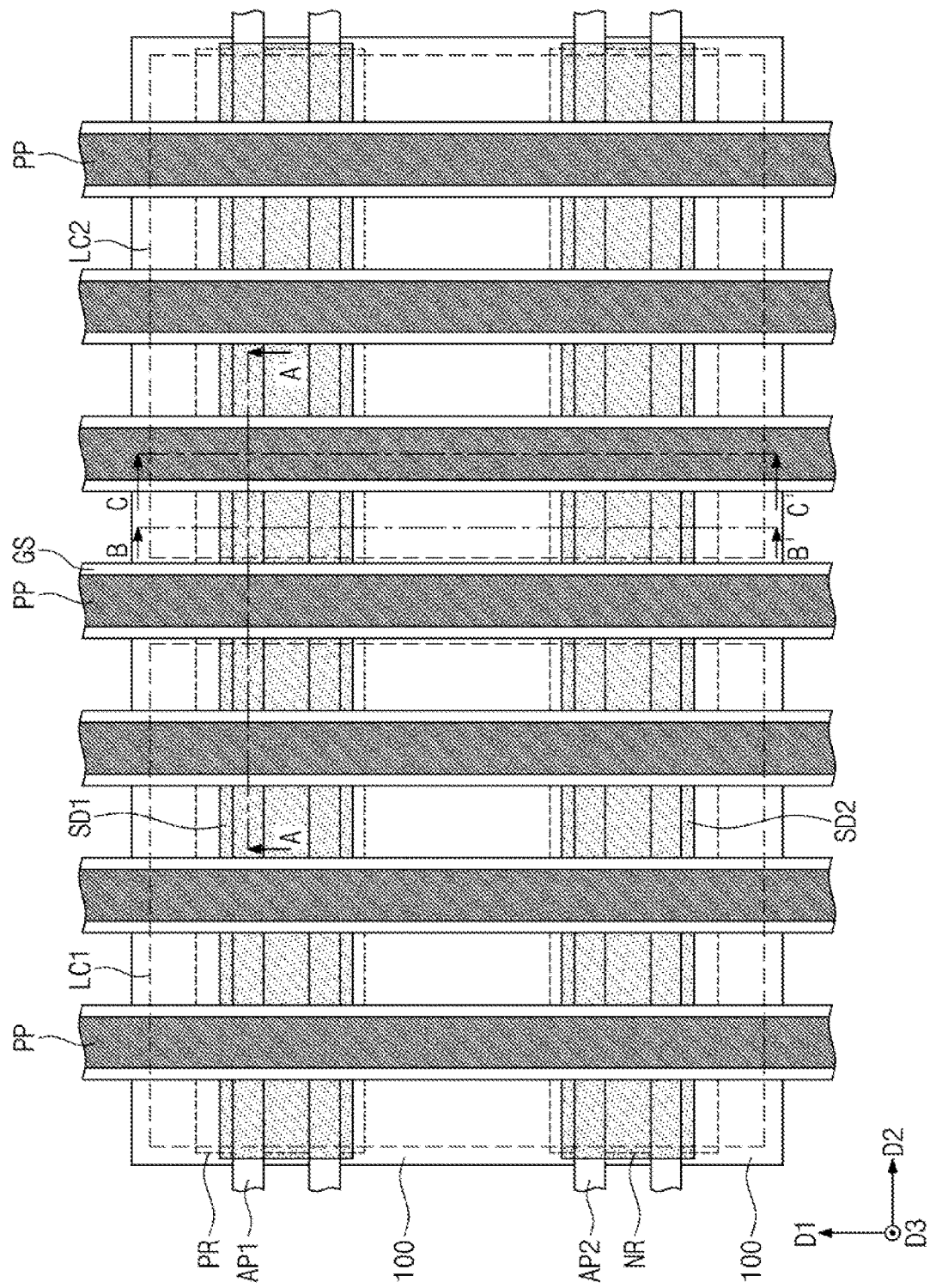

Referring to FIGS. 3 and 4, an upper portion of a substrate 100 may be patterned to form first and second active patterns AP1 and AP2. A first trench TR1 may be formed between the first active patterns AP1 and between the second active patterns AP2. The first trench TR1 may have a high aspect ratio, and thus the width thereof may be narrower downwardly. The first trench TR1 may be formed through a photolithographic process and an anisotropic etching process. A second trench TR2 may be formed between a PMOSFET region PR provided with the first active patterns AP1 and an NMOSFET region NR provided with the second active patterns AP2. The second trench TR2 may be formed through a photolithographic process and an anisotropic etching process.

A device isolation layer ST may be formed on the substrate 100 to fill the first and second trenches TR1 and TR2. The device isolation layer ST may be formed of or include at least one of insulating materials (e.g., silicon oxide ($SiO_2$)). The device isolation layer ST may be formed by a chemical vapor deposition (CVD) process, an atomic layer deposition (ALD) process, a physical vapor deposition (PVD) process, or the like. The device isolation layer ST may be recessed until upper portions of the first and second active patterns AP1 and AP2 are exposed. The process of recessing the device isolation layer ST may be a wet etch process. However, the present inventive concept is not limited thereto. For example, an anisotropic etching process capable of selectively etching the device isolation layer ST with respective to the first and second active patterns AP1 and AP2 may be performed. As a result, each of the upper portions of the first and second active patterns AP1 and AP2 may have a shape vertically protruding above the device isolation layer ST. Accordingly, the first and second active patterns AP1 and AP2 may protrude upwardly above the device isolation layer ST by a predetermined height.

Referring to FIGS. 5 and 6A to 6C, sacrificial patterns PP may be formed to cross the first and second active patterns AP1 and AP2. The sacrificial patterns PP may be line- or bar-shaped patterns extending in a first direction D1. The sacrificial patterns PP may be formed to have a first pitch P1.

The formation of the sacrificial patterns PP may include forming a sacrificial layer on the entire top surface of the substrate 100, forming hard mask patterns MA on the sacrificial layer, and patterning the sacrificial layer using the hard mask patterns MA as an etch mask. The sacrificial layer may be formed by any suitable deposition technique known in the art, including, for example, ALD, CVD, or PVD. The patterning of the sacrificial layer may include an anisotropic etching process such as reactive ion etching (RIE) process. In an example embodiment of the present inventive concept, the sacrificial layer may include a poly-silicon layer.

A pair of gate spacers GS may be formed on opposite side surfaces of each of the sacrificial patterns PP. The gate spacers GS may also be formed on opposite side surfaces of each of the first and second active patterns AP1 and AP2. For example, the gate spacers GS may be formed to cover exposed portions of the opposite side surfaces of each of the first and second active patterns AP1 and AP2 (e.g., not covered by the device isolation layer ST and the sacrificial patterns PP).

The formation of the gate spacers GS may include conformally forming a gate spacer layer to cover the entire top surface of the substrate 100 and anisotropically etching the gate spacer layer. The gate spacer layer may be formed by a CVD process, an ALD process, or the like. The gate spacer layer may be formed of or include at least one of, for example, SiCN, SiCON, or $Si_3N_4$. In an example embodiment of the present inventive concept, the gate spacer layer may have a multi-layered structure including at least two layers of SiCN, SiCON, and $Si_3N_4$ layers.

Referring to FIGS. 7 and 8A to 8C, first source/drain patterns SD1 may be formed on the exposed upper portion of each of the first active patterns AP1. A pair of the first source/drain patterns SD1 may be formed at both sides of each of the sacrificial patterns PP.

The upper portions of the first active patterns AP1 may be etched using the hard mask patterns MA and the gate spacers GS as an etch mask to form first recess regions. During the etching of the upper portions of the first active patterns AP1, the gate spacers GS may be removed from the opposite side surfaces of each of the first active patterns AP1, and the device isolation layer ST between the first active patterns AP1 may also be recessed.

Figure 8A:
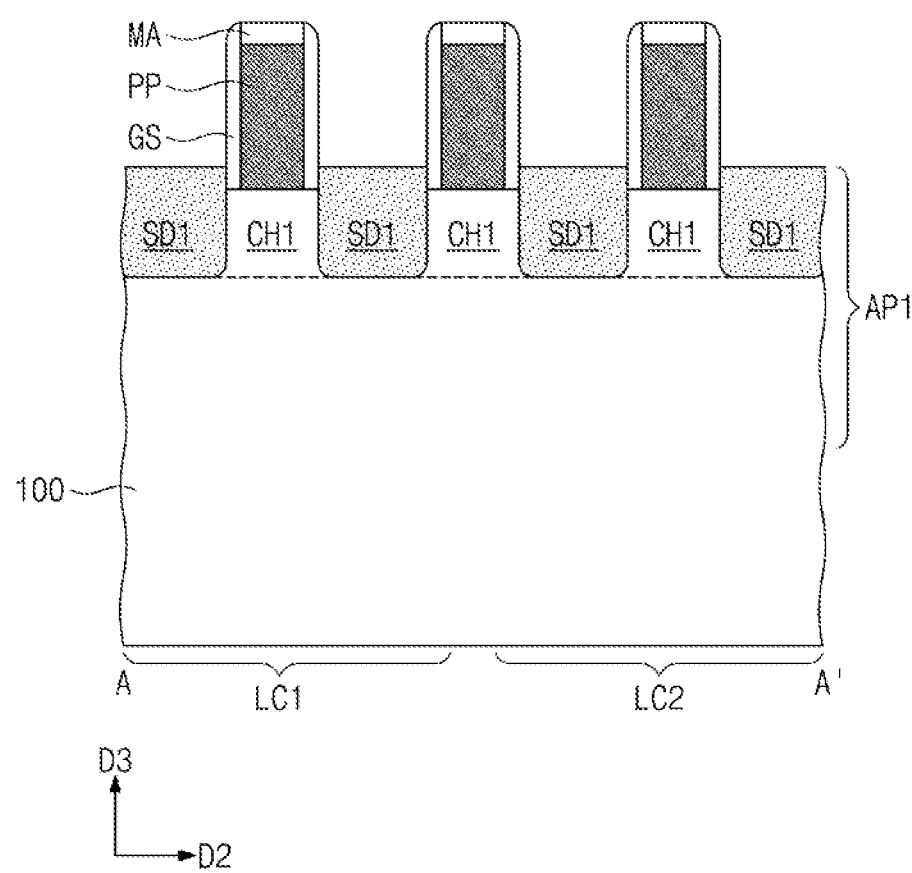
Figure 8B:
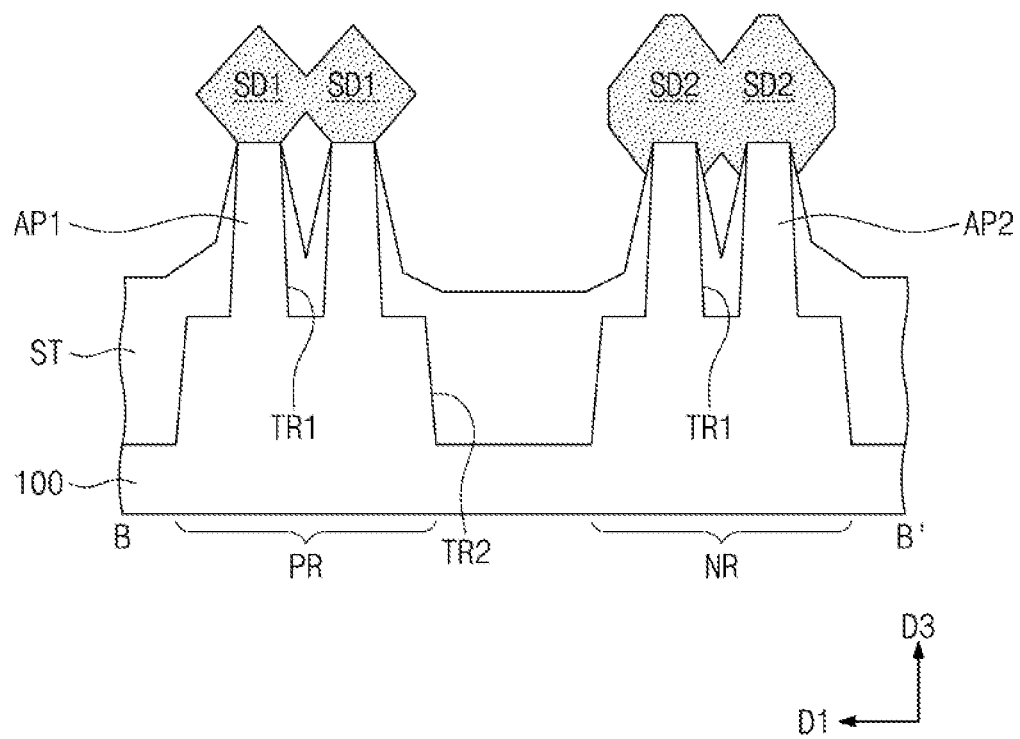
Figure 8C:
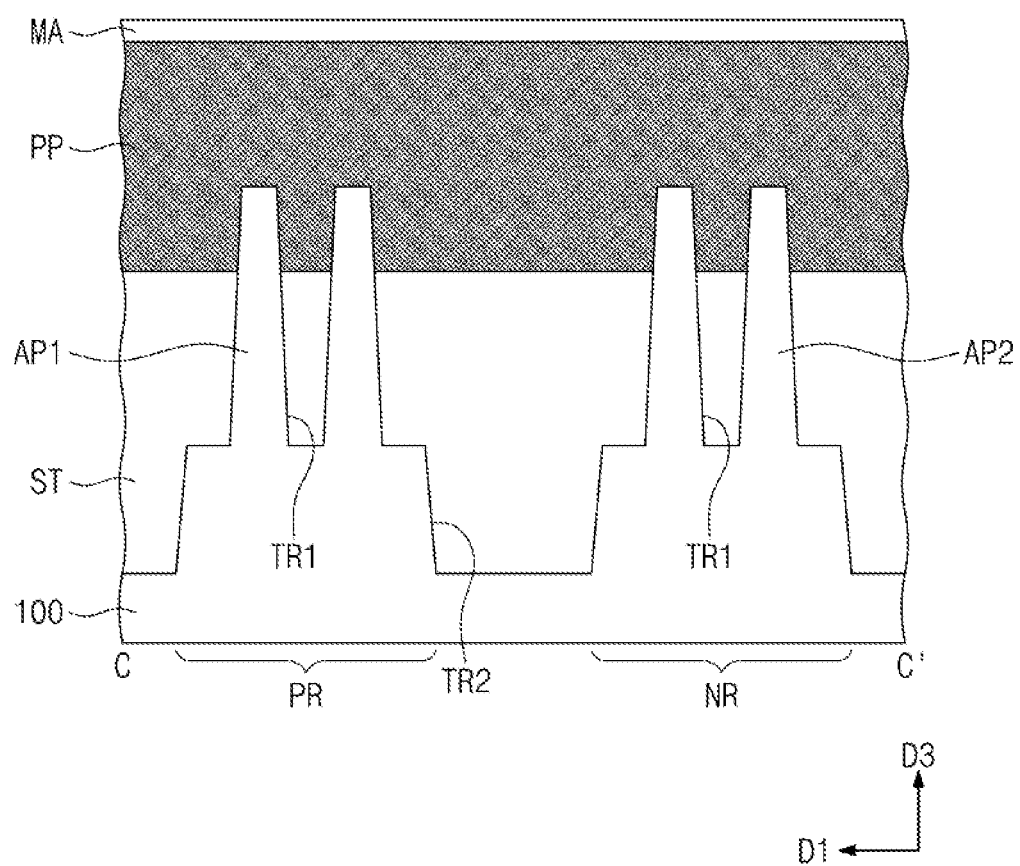
Figure 9:
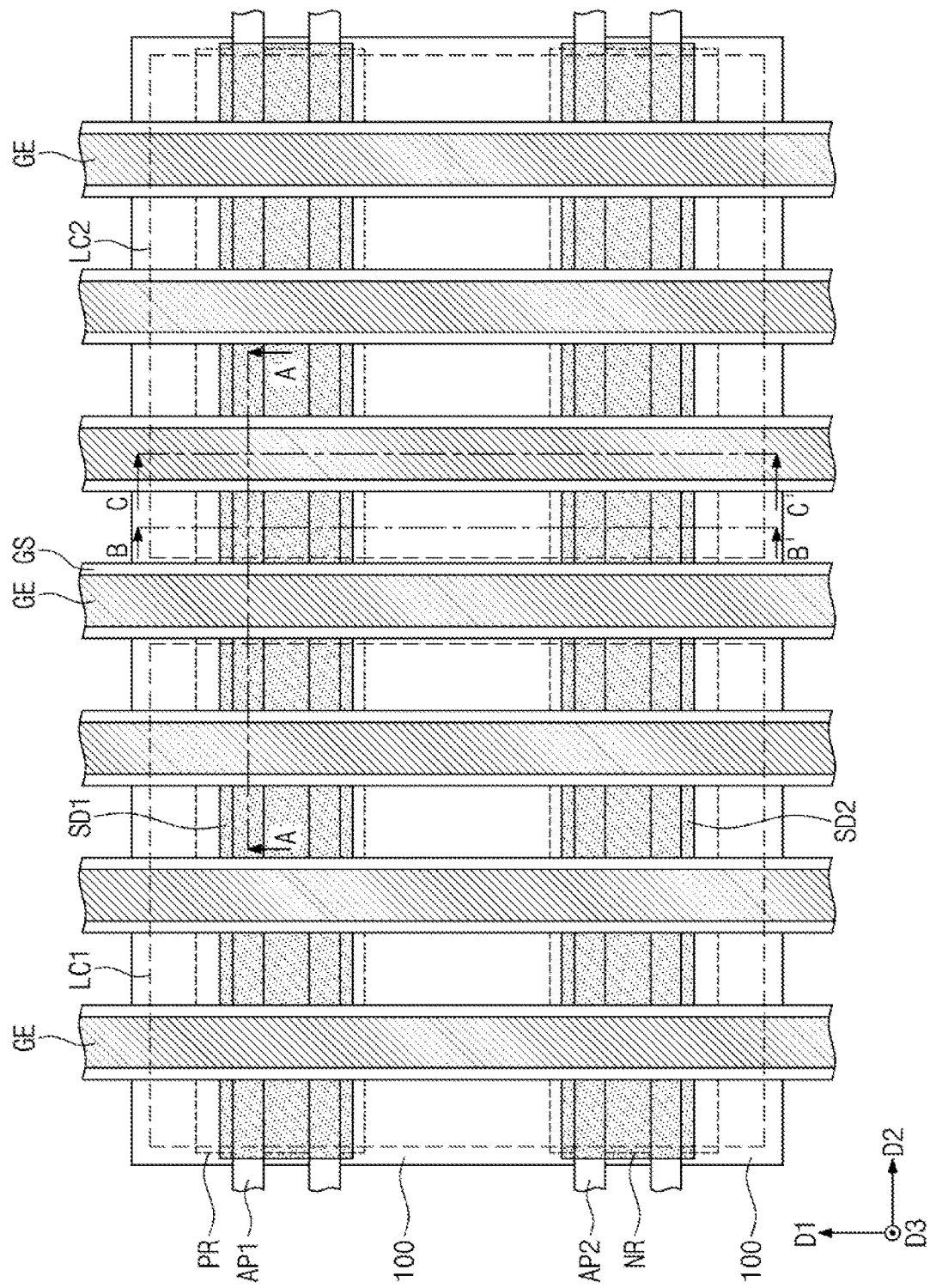
Figure 10A:
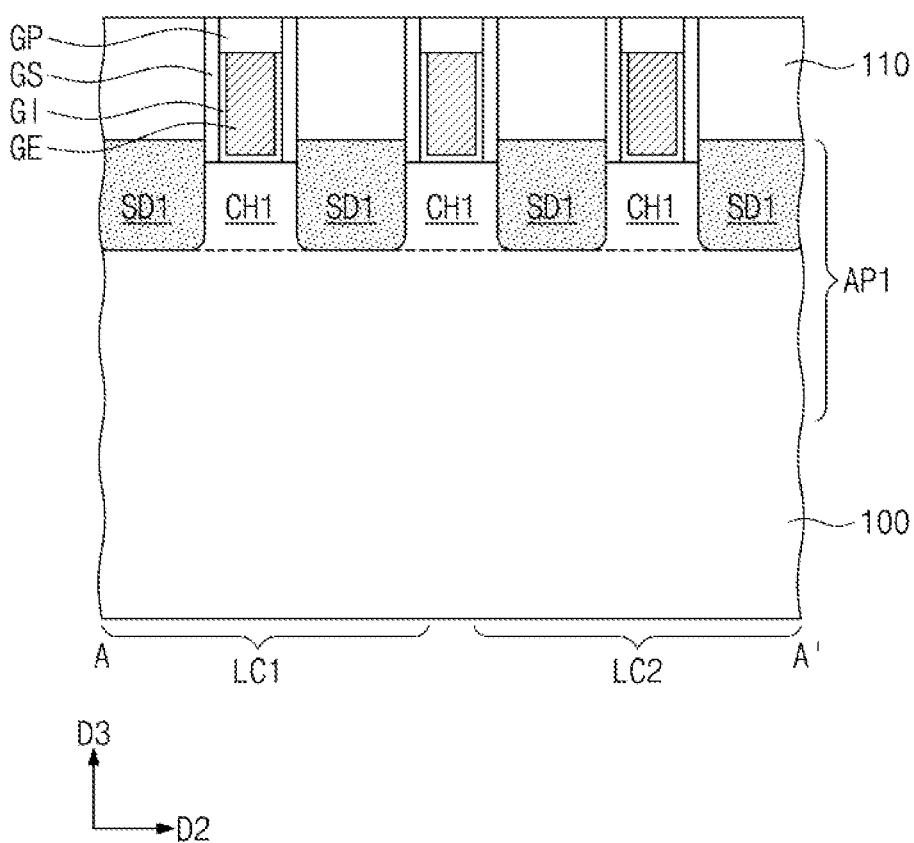
Figure 10B:
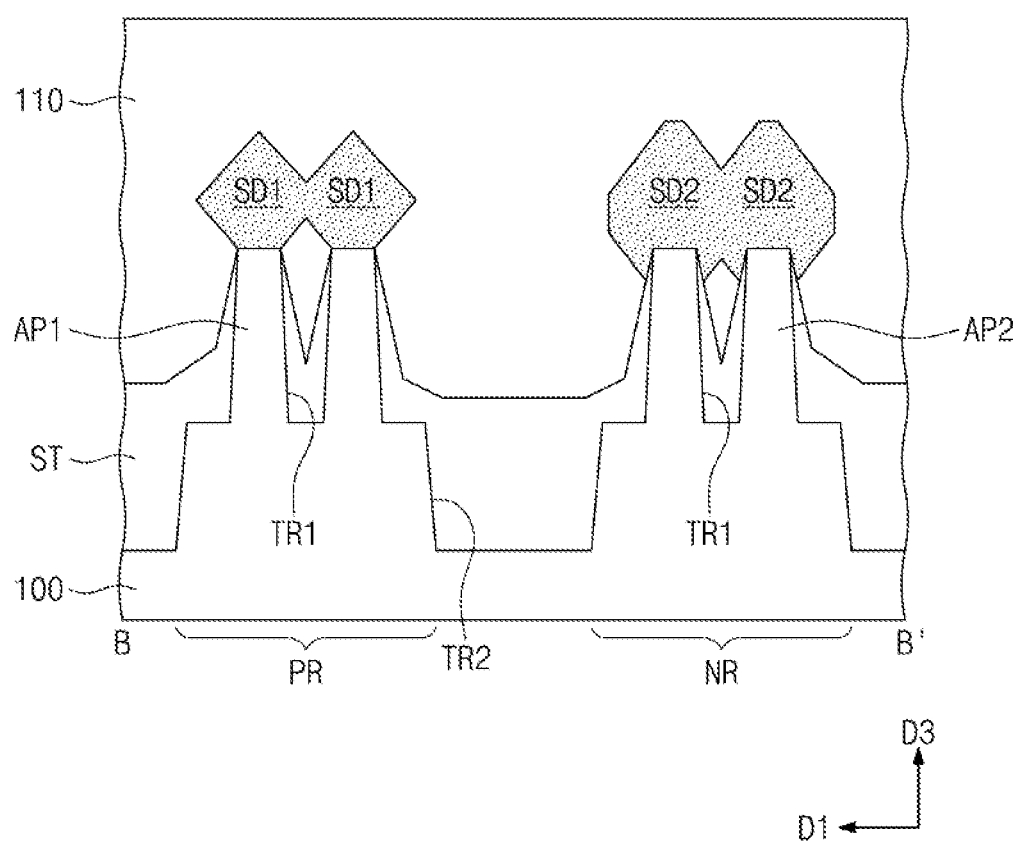
Figure 10C:
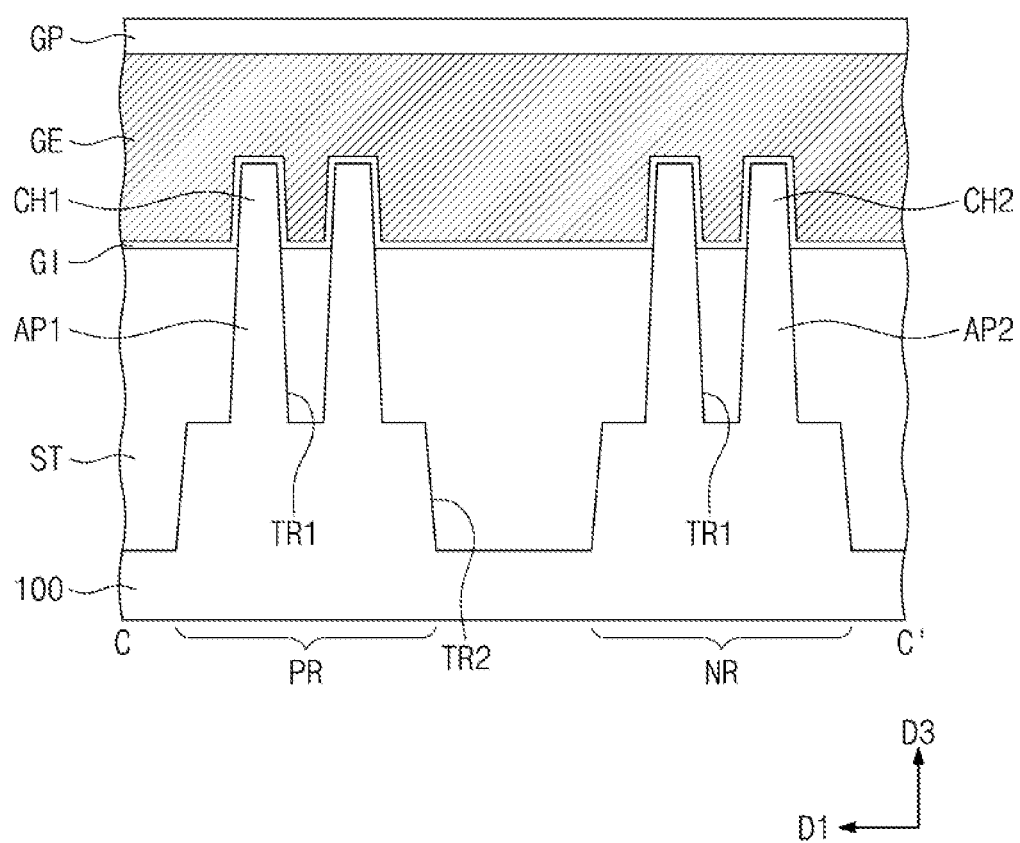

The first source/drain patterns SD1 may be formed by a selective epitaxial growth process, in which inner surfaces of the first recess regions of the first active patterns AP1 are used as a seed layer. The first source/drain patterns SD1 may have a pentagonal or hexagonal shape, as illustrated in FIG. 8B. However, the present inventive concept is not limited thereto. For example, the first source/drain patterns SD1 may have, for example, a circular shape, an oval shape, or a polygonal shape such as a quadrangular shape. In addition, two or more adjacent first source/drain patterns SD1 may be merged with one another in the selective epitaxial growth process. As a result of the formation of the first source/drain patterns SD1, a first channel region CH1 may be interposed between a pair of the first source/drain patterns SD1. In an example embodiment of the present inventive concept, the selective epitaxial growth process may include, for example, a CVD process or a molecular beam epitaxy (MBE) process. The first source/drain patterns SD1 may include a semiconductor material (e.g., SiGe) having a lattice constant greater than that of the semiconductor substrate 100. Each of the first source/drain patterns SD1 may be formed of a plurality of semiconductor layers.

In an example embodiment of the present inventive concept, the first source/drain patterns SD1 may be doped in situ during the selective epitaxial growth process. In an example embodiment of the present inventive concept, the first source/drain patterns SD1 may be doped with impurities by an ion implantation process after the formation of the first source/drain patterns SD1. The first source/drain patterns SD1 may be doped to have a first conductivity type (e.g., p-type). For example, the first source/drain patterns SD1 may be formed to include silicon-germanium (SiGe), and a p-type impurity doping and a heat treatment may be performed so that the first source/drain patterns SD1 may serve as a source/drain of a PMOS transistor in the PMOSFET region PR.

Second source/drain patterns SD2 may be formed on an exposed upper portion of each of the second active patterns AP2. A pair of the second source/drain patterns SD2 may be formed at both sides of each of the sacrificial patterns PP.

The upper portions of the second active patterns AP2 may be etched using the hard mask patterns MA and the gate spacers GS as an etch mask to form second recess regions. The second source/drain patterns SD2 may be formed by a selective epitaxial growth process, in which inner sidewalls of the second recess regions of the second active patterns AP2 are used as a seed layer. The second source/drain patterns SD2 may have a polygonal shape, as illustrated in FIG. 8B. However, the present inventive concept is not limited thereto. In addition, two or more adjacent second source/drain patterns SD2 may be merged with one another in the selective epitaxial growth process. As a result of the formation of the second source/drain patterns SD2, a second channel region CH2 may be interposed between a pair of the second source/drain patterns SD2. In an example embodiment of the present inventive concept, the second source/drain patterns SD2 may include a semiconductor material (e.g., Si) the same as that of the substrate 100. The second source/drain patterns SD2 may be doped to have a second conductivity type (e.g., n-type). For example, the second source/drain patterns SD2 may be formed to include silicon carbide (SiC) or silicon (Si), and an n-type impurity doping and a heat treatment may be performed so that the second source/drain patterns SD2 may serve as a source/drain of an NMOS transistor in the NMOSFET region NR.

The first source/drain patterns SD1 and the second source/drain patterns SD2 may be sequentially formed by different processes. In other words, the first source/drain patterns SD1 and the second source/drain patterns SD2 may not be formed at the same time.

Referring to FIGS. 9 and 10A to 10C, a first interlayer insulating layer 110 may be formed to cover the first and second source/drain patterns SD1 and SD2, the hard mask patterns MA, and the gate spacers GS. In an example embodiment of the present inventive concept, the first interlayer insulating layer 110 may be formed of or include silicon oxide ($SiO_2$). The first interlayer insulating layer 110 may be formed by a CVD process, a PVD process, a spin coating process, or the like.

The first interlayer insulating layer 110 may be planarized until top surfaces of the sacrificial patterns PP are exposed. The planarization of the first interlayer insulating layer 110 may be performed using an etch-back process or a chemical mechanical polishing (CMP) process. All of the hard mask patterns MA may be removed during the planarization process. Accordingly, the top surface of the first interlayer insulating layer 110 may be coplanar with the top surfaces of the sacrificial patterns PP and the top surfaces of the gate spacers GS.

The sacrificial patterns PP may be replaced with gate electrodes GE. In detail, the exposed sacrificial patterns PP may be selectively removed. For example, the sacrificial patterns PP may be removed by a wet etching process. However, the present inventive concept is not limited thereto. For example, the sacrificial patterns PP may be removed by a dry etching process. Empty spaces may be formed as a result of the removal of the sacrificial patterns PP. A gate dielectric pattern GI, a gate electrode GE, and a gate capping pattern GP may be formed in each of the empty spaces. The gate dielectric pattern GI may be conformally formed so as not to completely fill the empty space. The gate dielectric pattern GI may be formed by an atomic layer deposition (ALD) or chemical oxidation process. In an example embodiment of the present inventive concept, the gate dielectric pattern GI may be formed of or include at least one of high-k dielectric materials.

The formation of the gate electrode GE may include forming a gate electrode layer to fill the entire remaining portion of the empty space and planarizing the gate electrode layer. In an example embodiment of the present inventive concept, the gate electrode layer may be formed of or include at least one of conductive metal nitrides or metallic materials. The gate electrode layer may be formed by a CVD process, an ALD process, a PVD process, or the like.

Thereafter, an upper portion of the gate electrode GE may be recessed. The gate capping pattern GP may be formed on the recessed gate electrode GE. The gate capping pattern GP may be formed of or include at least one of, for example, SiON, SiCN, SiCON, or $Si_3N_4$. The gate capping pattern GP may be formed by a CVD process, an ALD process, a PVD process, or the like.

Referring to FIGS. 11 and 12A to 12E, a second interlayer insulating layer 120 may be formed on the first interlayer insulating layer 110. The second interlayer insulating layer 120 may be formed of or include at least one of silicon oxide or low-k oxide materials. As an example, the low-k oxide materials may include carbon-doped silicon oxide, such as SiCOH. The second interlayer insulating layer 120 may be formed by a CVD process.

A hard mask pattern HMP with an opening OP may be formed on the second interlayer insulating layer 120. The hard mask pattern HMP may be formed through a photolithographic process and an anisotropic etching process. The hard mask pattern HMP may cover a first logic cell LC1 and a second logic cell LC2. The opening OP may be formed to expose a cell boundary between the first and second logic cells LC1 and LC2. The opening OP may vertically overlap the gate electrode GE, which is placed on the cell boundary between the first and second logic cells LC1 and LC2.

A hole HO may be formed by an etching process, in which the hard mask pattern HMP is used as an etch mask. The etching process may be an anisotropic etching process. The etching process may be performed to sequentially etch the second interlayer insulating layer 120, the gate capping pattern GP, the gate electrode GE, and a bottom layer of the gate dielectric pattern GI through the opening OP. The hole HO may be formed to expose the first and second active patterns AP1 and AP2 and the device isolation layer ST, which are located between the first and second logic cells LC1 and LC2. For example, the hole HO may be formed to expose the first and second channel regions CH1 and CH2 and the device isolation layer ST, which are located between the first and second logic cells LC1 and LC2. The gate dielectric pattern GI covering the gate spacer GS may not be etched during the formation of the hole HO. For example, the gate dielectric pattern GI may remain on the gate spacer GS, after the formation of the hole HO. Since the gate dielectric pattern GI may function as a blocking layer in a subsequent etch process, by maintaining good film quality of the existing gate dielectric pattern GI during the formation of the hole HO, there is no need to form a new blocking layer and thus reducing process steps, increasing productivity and enhancing reliability. However, if there is no existing gate dielectric pattern GI, a new blocking layer the same as or similar to the gate dielectric pattern GI may be formed to cover the gate spacer GS in the hole HO.

Referring back to FIGS. 1 and 2A to 2E, the first and second active patterns AP1 and AP2 exposed by the hole HO may be anisotropically etched to form first recesses RS1. The first recess RS1 may be formed to penetrate an upper portion of each of the first and second active patterns AP1 and AP2. For example, the first recess RS1 may be formed to be shallower or deeper than the first trench TR1. For example, when the first recess RS1 is formed to be deeper than the first trench TR1, it may be formed to be shallower or deeper than the second trench TR2.

During the selective etching of the first and second active patterns AP1 and AP2, the device isolation layer ST exposed by the hole HO may be partially etched to form a second recess RS2. The second recess RS2 may be shallower than the first recess RS1.

During the selective etching of the first and second active patterns AP1 and AP2, the gate dielectric pattern GI exposed by the hole HO may be used as a blocking layer preventing a lateral etching. The gate dielectric pattern GI may prevent the first and second source/drain patterns SD1 and SD2 adjacent to the hole HO from being exposed to etchant for the selective etching of the first and second active patterns AP1 and AP2 (e.g., see FIGS. 2B and 12B). Thus, due to the existence of the gate dielectric pattern GI covering the gate spacer GS remaining around the hole HO, the first and second source/drain patterns SD1 and SD2 may not be etched during the selective etching of the first and second active patterns AP1 and AP2. At the same time, the first and second active patterns AP1 and AP2 may be successfully etched to cut the fin shape first and second active patterns AP1 and AP2. On the other hand, without the existence of the gate dielectric pattern GI covering the gate spacer GS remaining around the hole HO, the first and second source/drain patterns SD1 and SD2 may be attacked by the lateral etching, and at the same time the fin shape first and second active patterns AP1 and AP2 may not be cut or insufficiently cut.

A separation structure SS may be formed by forming an insulating layer filling the hole HO, the first recess RS1, and the second recess RS2. The insulating layer may include, for example, a silicon oxide ($SiO_2$) layer, a silicon nitride ($Si_3N_4$) layer, or a silicon oxynitride (SiON) layer. The insulating layer may be formed by a CVD process, an ALD process, a PVD process, or the like. A planarization process on the insulating layer may be performed until the second interlayer insulating layer 120 is exposed. The planarization of the second interlayer insulating layer 120 may be performed using an etch-back process or a CHIP process.

Active contacts AC may be formed to penetrate the second interlayer insulating layer 120 and the first interlayer insulating layer 110 and to be electrically connected to the first and second source/drain patterns SD1 and SD2. The formation of the active contacts AC may include forming contact holes to expose the first and second source/drain patterns SD1 and SD2 and forming a conductive layer to fill the contact holes. The contact holes may be formed through a photolithographic process and an anisotropic etching process. The conductive layer may be formed by a CVD process, an ALD process, a PVD process, or the like. Also, a plurality of interconnection layers may further be formed on the second interlayer insulating layer 120. The interconnection layers may electrically connect the first and second logic cells LC1 and LC2 to other logic cells.

According to an example embodiment of the present inventive concept, during the formation of the separation structure SS, the gate dielectric pattern GI may be used as a blocking layer protecting the first and second source/drain patterns SD1 and SD2 adjacent thereto. Thus, a process defect may be reduced to enhance reliability of a semiconductor device.

Figure 13A:
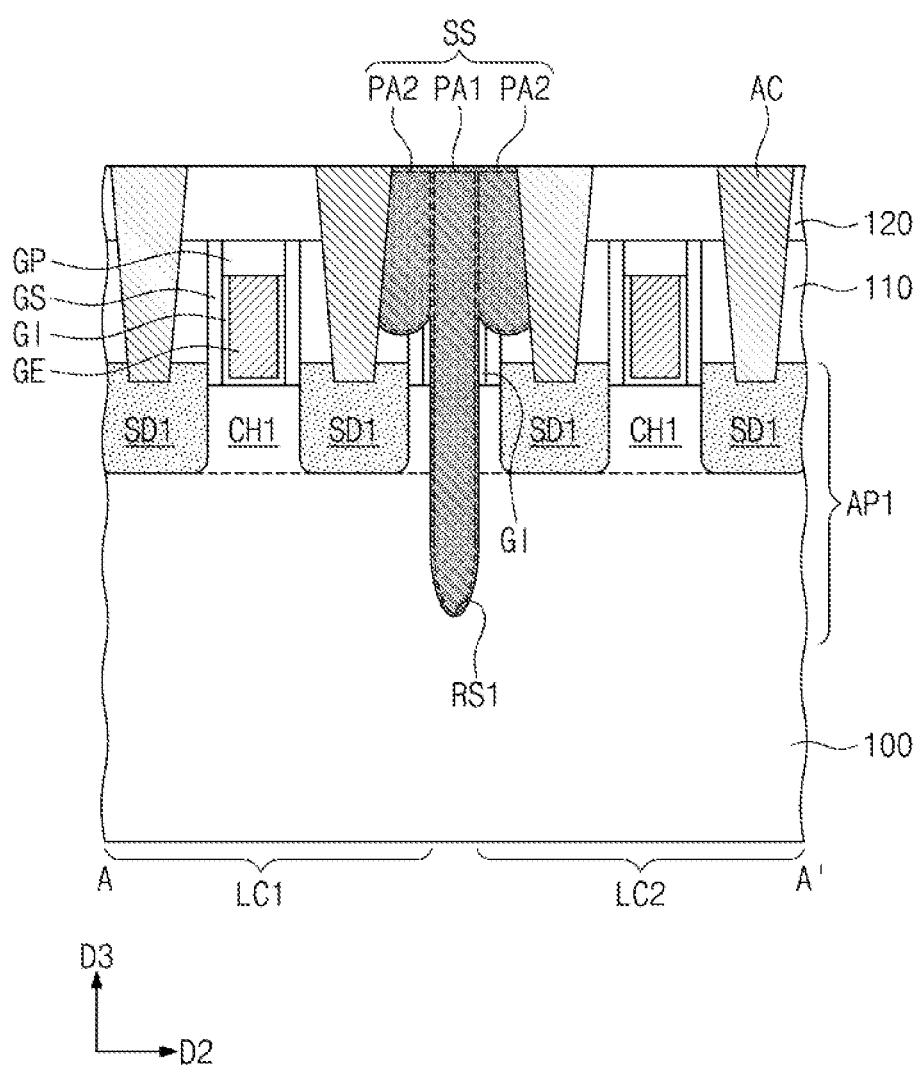
FIGS. 13A and 13B are cross-sectional views, which are taken along lines A-A' and B-B', respectively, of FIG. 1 and illustrate a semiconductor device according to an example embodiment of the present inventive concept.
Figure 13B:
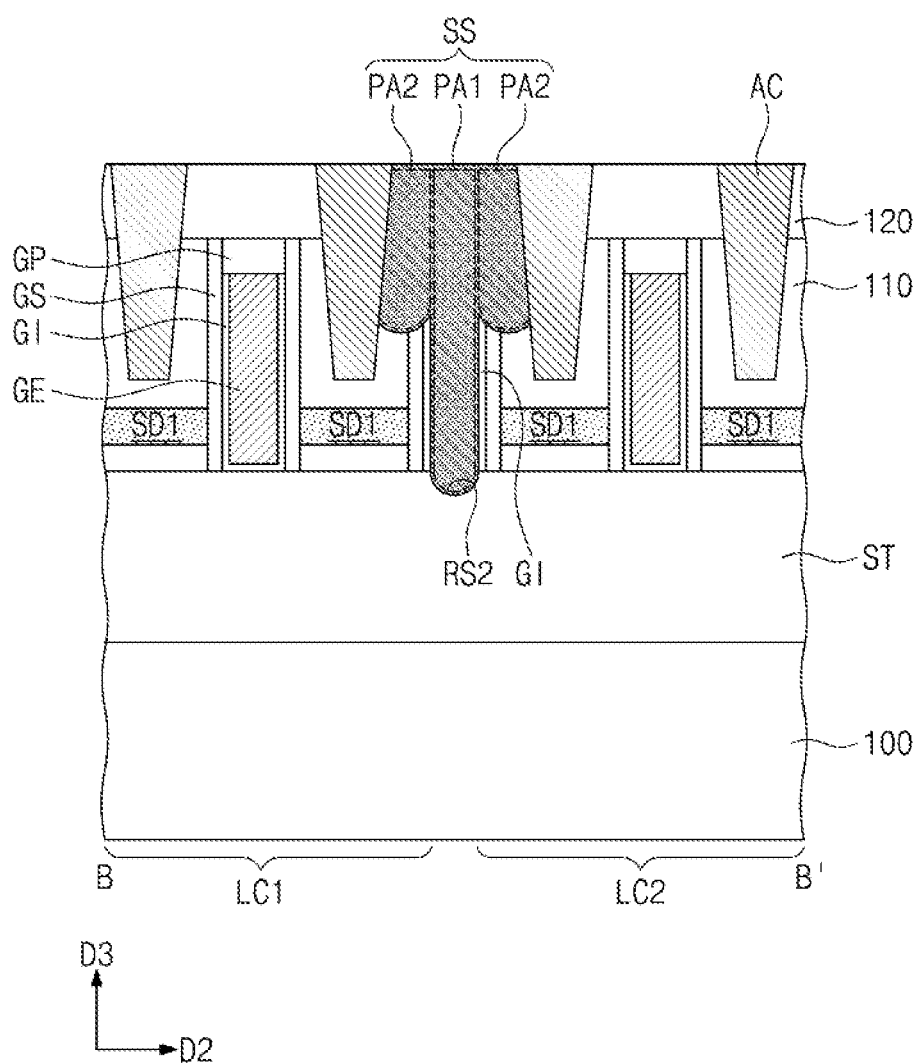

FIGS. 13A and 13B are cross-sectional views, which are taken along lines A-A' and B-B', respectively, of FIG. 1 and illustrate a semiconductor device according to an example embodiment of the present inventive concept. In the following description, an element previously described with reference to FIGS. 1 and 2A to 2E may be identified by the same reference number without repeating an overlapping description thereof.

Referring to FIGS. 1, 13A, and 13B, the separation structure SS may include a first portion PA1 and a pair of second portions PA2, which are provided at both sides of the first portion PA1. The first portion PA1 of the separation structure SS may be provided to fill the first recess RS1 and the second recess RS2. The first portion PA1 of the separation structure SS may extend toward the bottom surface of the substrate 100 to penetrate the upper portion of the first or second active pattern AP1 or AP2. For example, the first portion PA1 of the separation structure SS may extend vertically in the third direction D3 toward the bottom surface of the substrate 100 between the first logic cell LC1 and the second logic cell LC2 to separate the first and second active patterns AP1 and AP2 of the first logic cell LC1 from the first and second active patterns AP1 and AP2 of the second logic cell LC2.

The second portion PA2 of the separation structure SS may be provided to penetrate upper portions of the gate spacer GS and the gate dielectric pattern GI. For example, the upper portions of the gate spacer GS and the gate dielectric pattern GI and portions of the first and second interlayer insulating layers 110 and 120 adjacent thereto may be replaced by the second portion PA2. Thus, the second portion PA2 may be provided over the gate spacer GS and the gate dielectric pattern GI. A level of a top surface of the gate spacer GS below the second portion PA2 may be lower than a level of a top surface of the gate spacer GS on the gate electrode GE. A level of a top surface of the gate dielectric pattern GI below the second portion PA2 may be lower than a level of a top surface of the gate dielectric pattern GI on the gate electrode GE. In an example embodiment of the present inventive concept, the first portion PA1 and the pair of second portions PA2 may be formed as one integral structure without being separated from each other.

Figure 11:
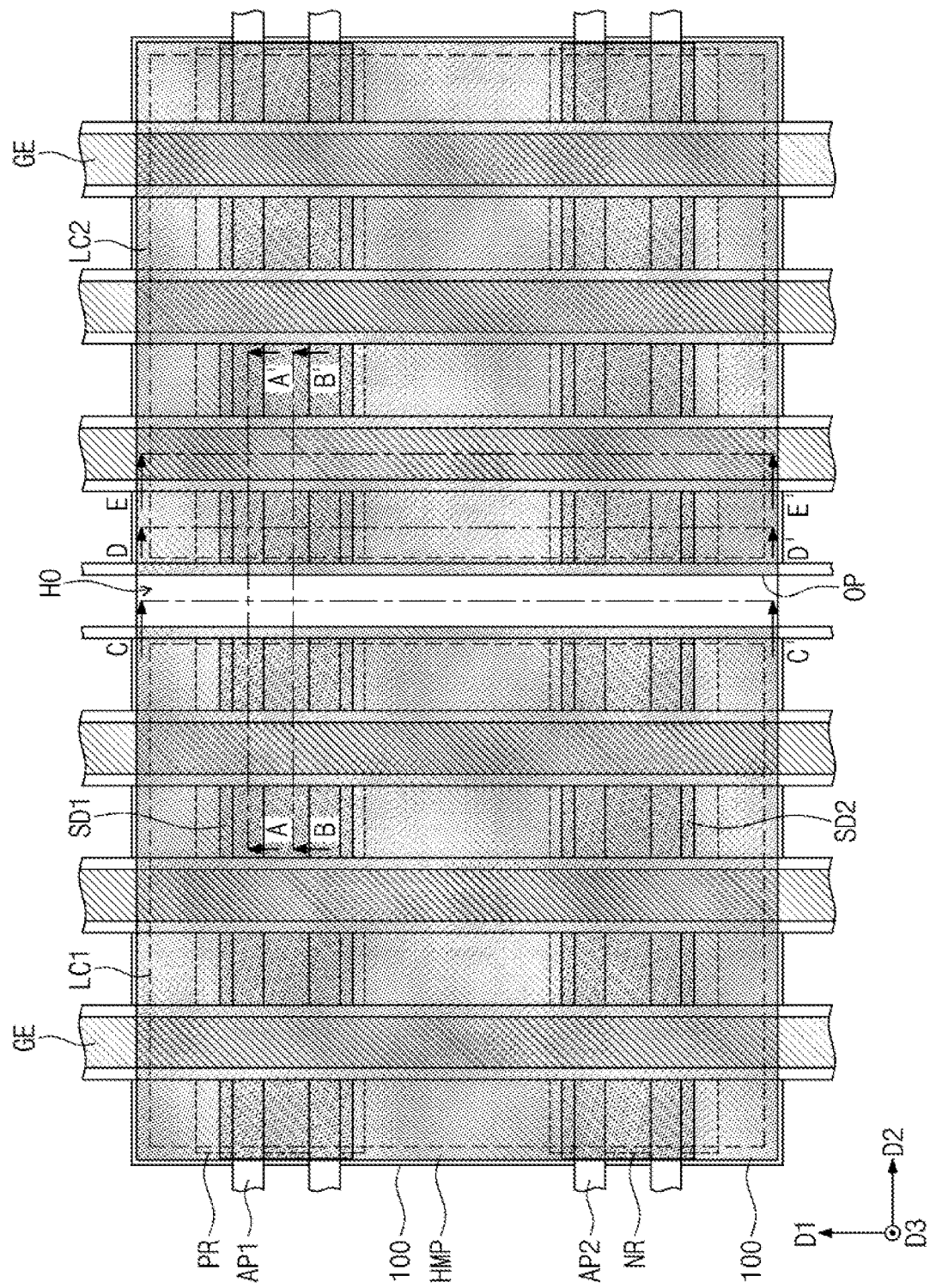
Figure 12A:
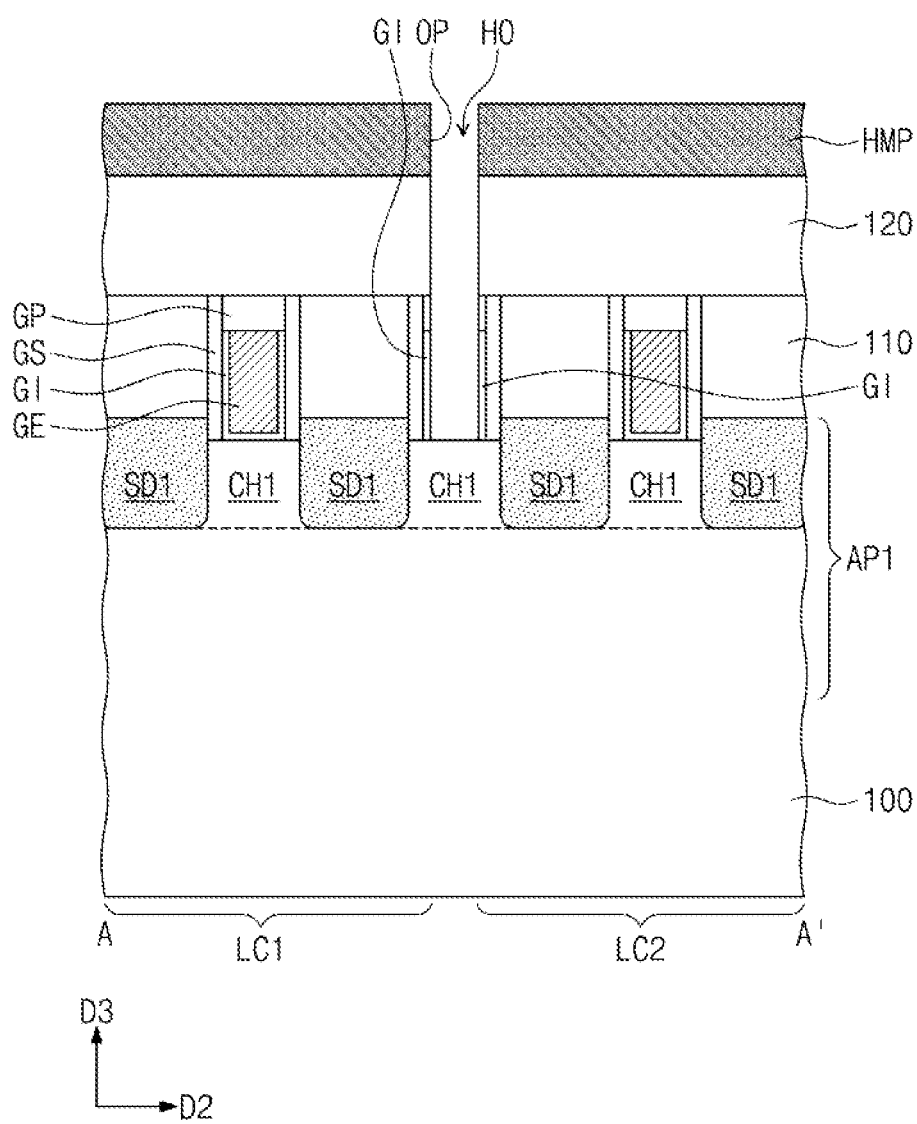
Figure 12B:
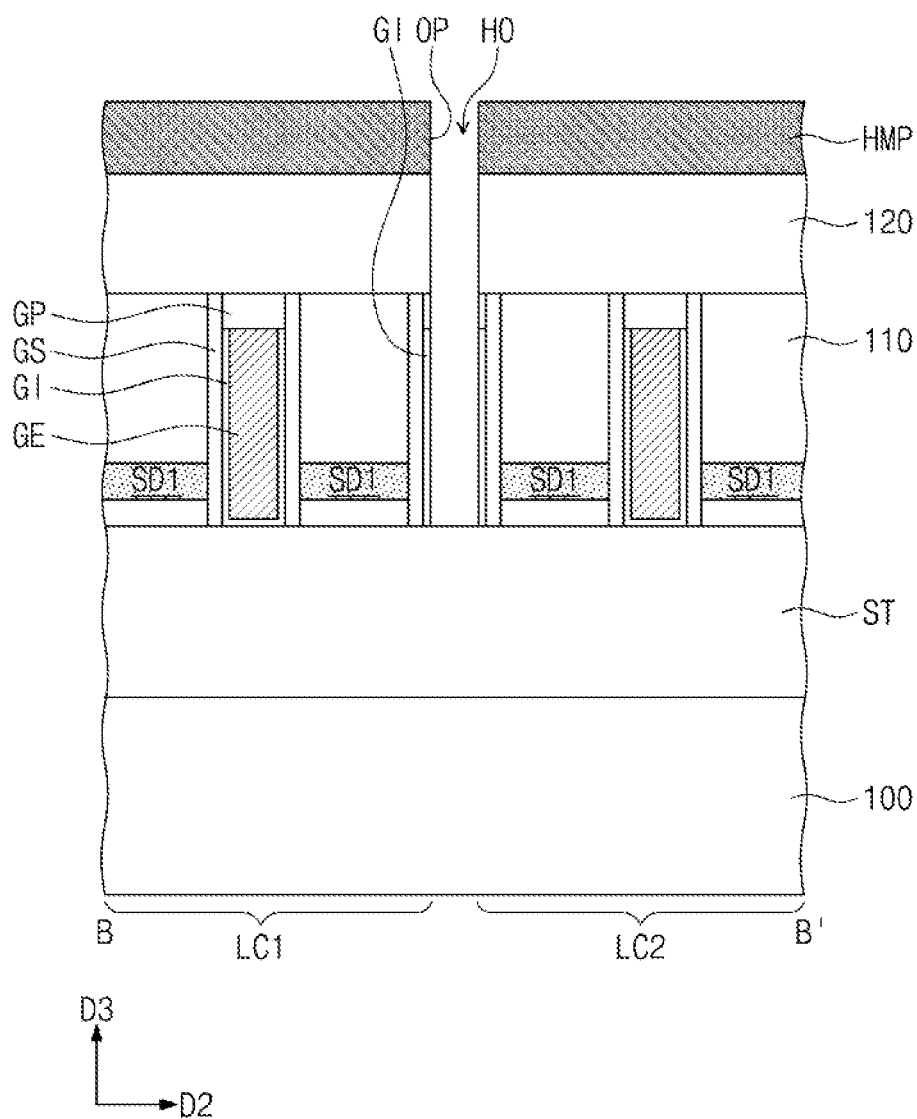
Figure 12C:
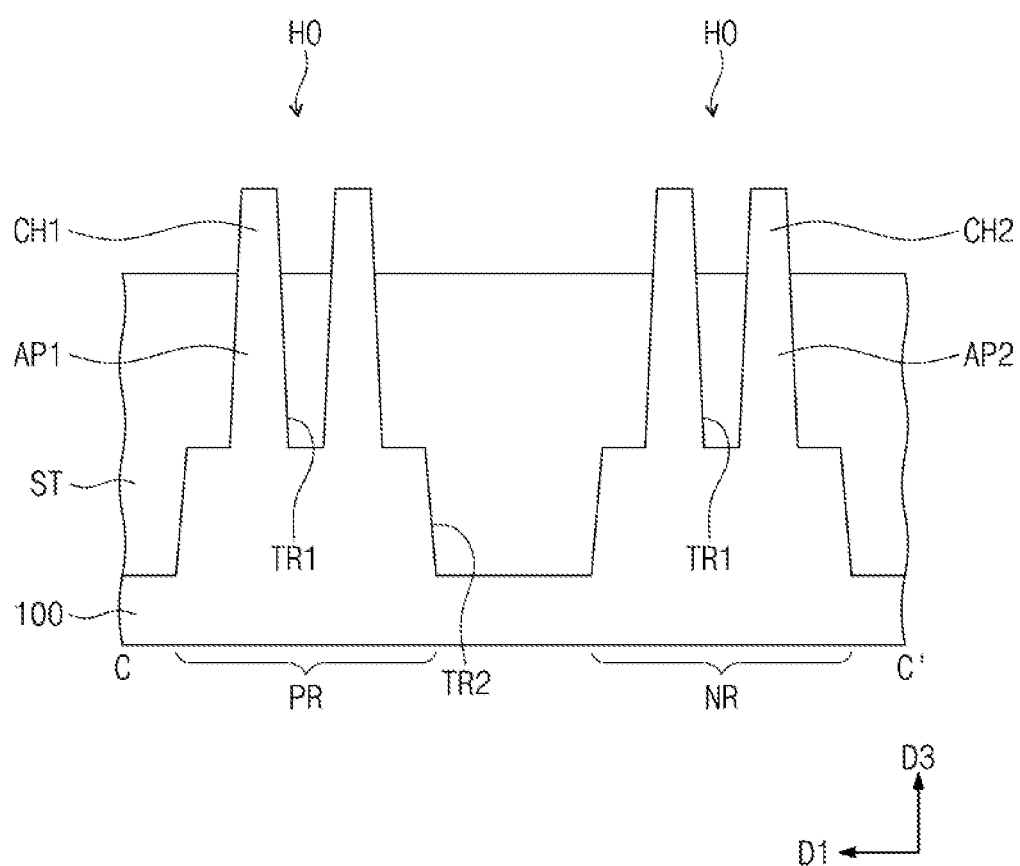
Figure 12D:
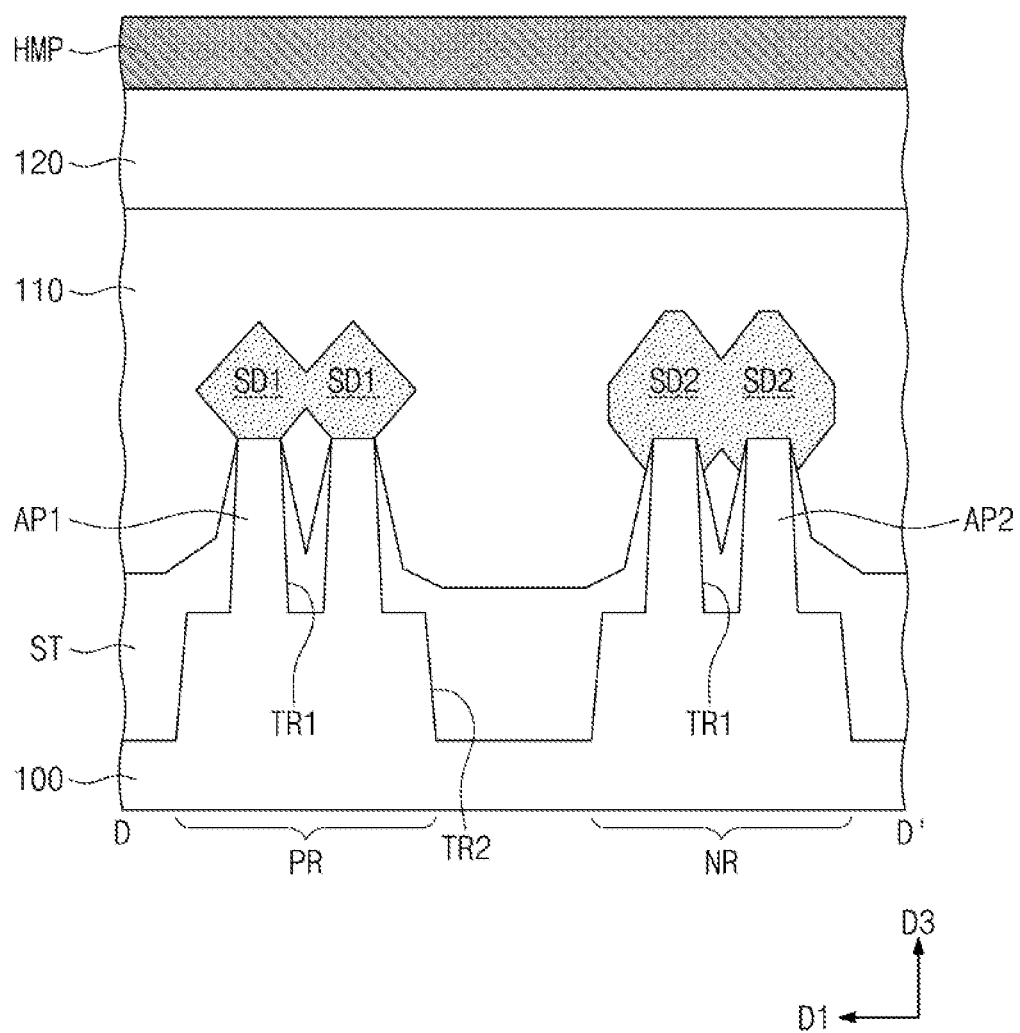
FIG. 12D is a cross-sectional view taken along line D-D' of FIG. 11.
Figure 12E:
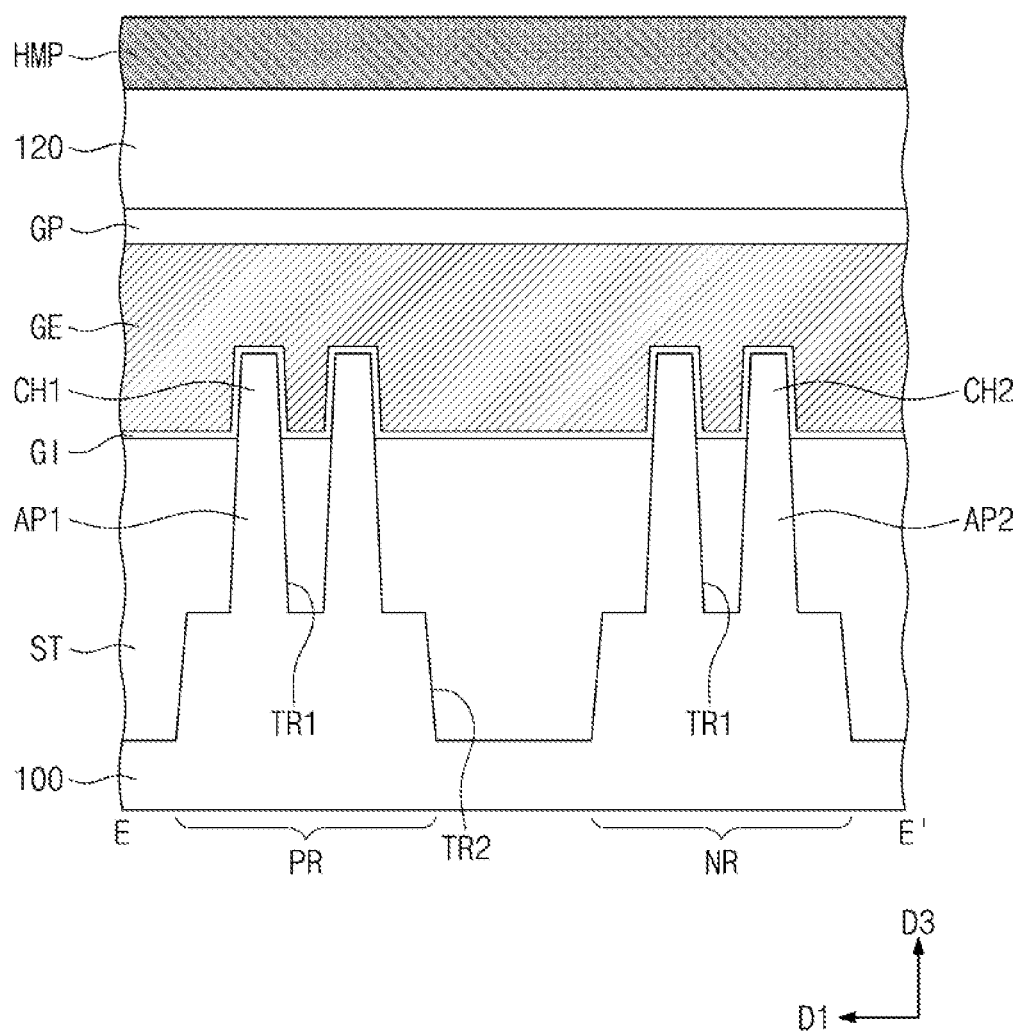
FIG. 12E is a cross-sectional view taken along line E-E' of FIG. 11.
Figure 14A:
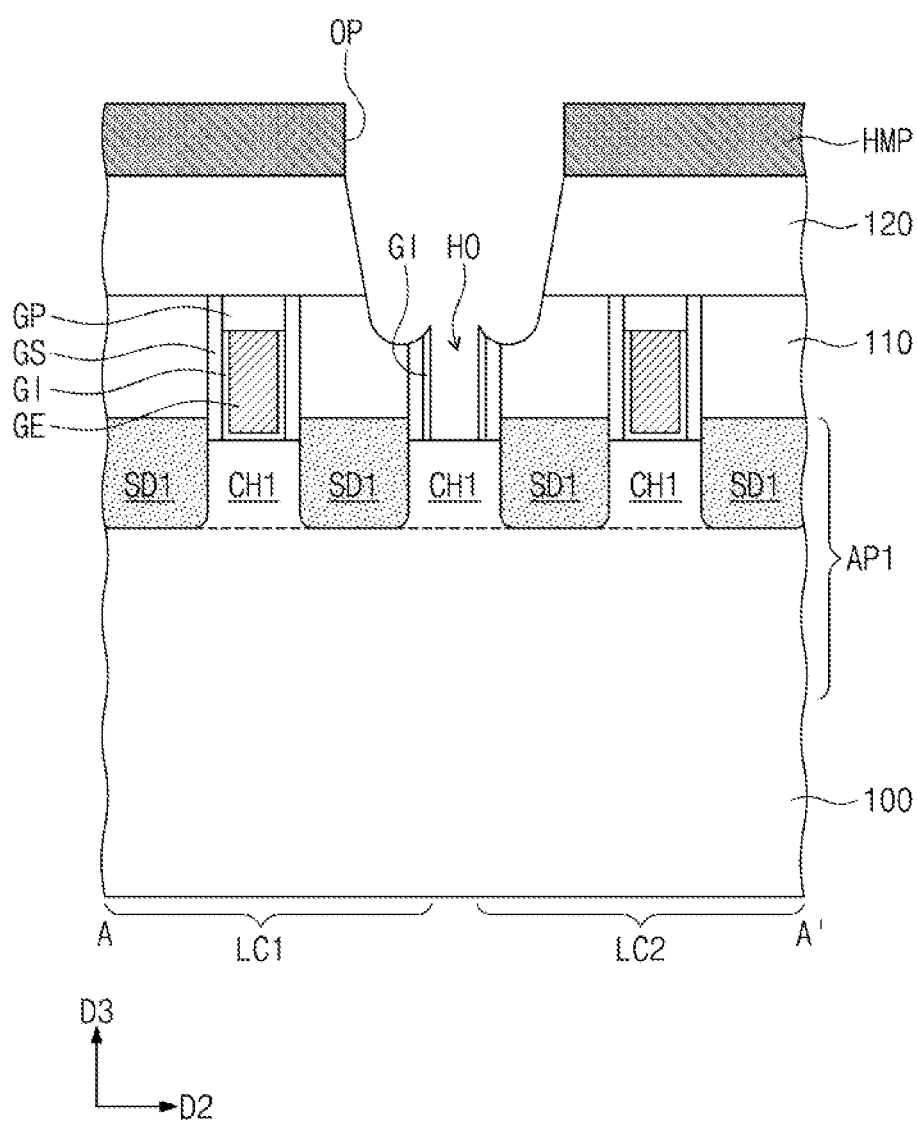
FIGS. 14A and 14B are cross-sectional views, which are taken along lines A-A' and B-B', respectively, of FIG. 11 and illustrate a method of fabricating a semiconductor device according to an example embodiment of the present inventive concept.
Figure 14B:
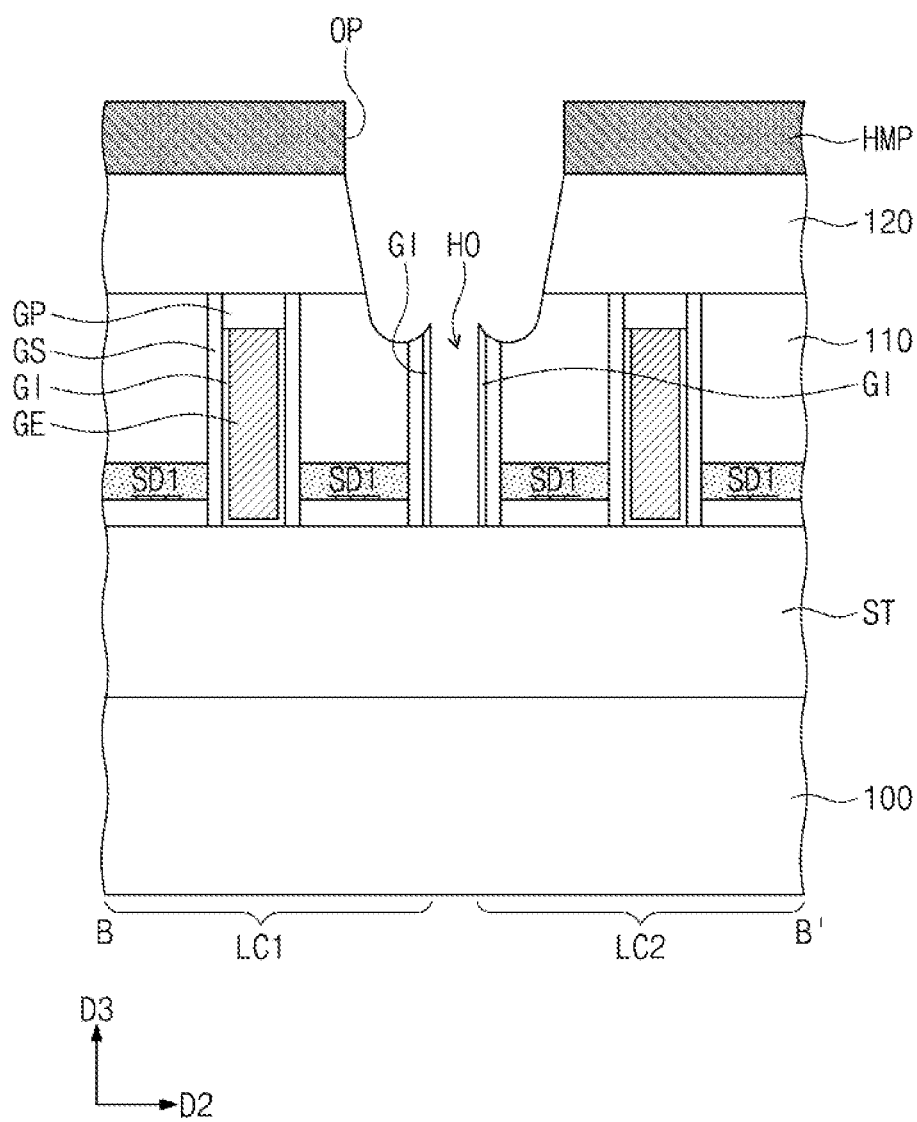

FIGS. 14A and 14B are cross-sectional views, which are taken along lines A-A' and B-B', respectively, of FIG. 11 and illustrate a method of fabricating a semiconductor device according to an example embodiment of the present inventive concept. In the following description, an element or step previously described with reference to FIGS. 3 to 12E may be identified by the same reference number without repeating an overlapping description thereof.

Referring to FIGS. 11, 14A, and 14B, the hard mask pattern HMP with the opening OP may be formed on the structure of FIGS. 9 and 10A to 10C. The hard mask pattern HMP may be formed through a photolithographic process and an anisotropic etching process. The hard mask pattern HMP may cover major portions of the first logic cell LC1 and the second logic cell LC2. The opening OP according to the present embodiment may be formed to be larger than the opening OP previously described with reference to FIGS. 11 and 12A to 12E. Thus, the opening OP may be formed to overlap a cell boundary between the first and second logic cells LC1 and LC2 and portions of the first and second logic cells LC1 and LC2 adjacent to the cell boundary.

The hole HO may be formed by an etching process, in which the hard mask pattern HMP is used as an etch mask. The second interlayer insulating layer 120, the first interlayer insulating layer 110, the gate spacer GS, and the gate dielectric pattern GI exposed by the opening OP may be etched during the etching process. A portion of the gate spacer GS exposed by the opening OP may have a top surface that is lower than that of an unexposed portion of the gate spacer GS. A portion of the gate dielectric pattern GI exposed by the opening OP may have a top surface that is lower than that of an unexposed portion of the gate dielectric pattern GI. Although top portion of the gate dielectric pattern may be etched, portions of the gate dielectric pattern GI adjacent to the first and second source/drain patterns SD1 and SD2 may not be etched and remaining around the hole HO.

Subsequent steps may be performed in the same manner as those described with reference to FIGS. 1 and 2A to 2E. According to an example embodiment of the present inventive concept, during the formation of the separation structure SS including the first portion PA1 and the pair of second portions PA2 provided at both sides of the first portion PA1, the gate dielectric pattern GI may be used as a blocking layer protecting the first and second source/drain patterns SD1 and SD2 adjacent thereto. Thus, a process defect may be reduced to enhance reliability of a semiconductor device.

Figure 15A:
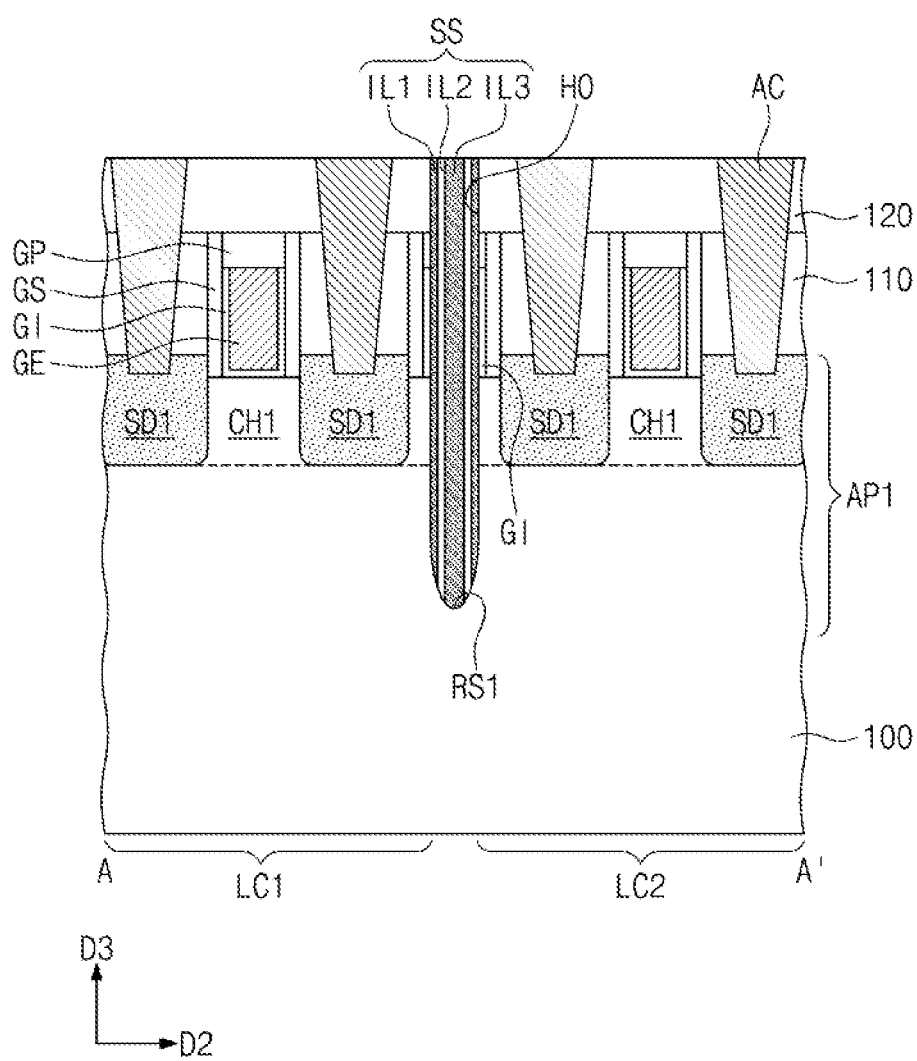
FIGS. 15A and 15B are cross-sectional views, which are taken along lines A-A' and B-B', respectively, of FIG. 1 and illustrate a semiconductor device according to an example embodiment of the present inventive concept.
Figure 15B:
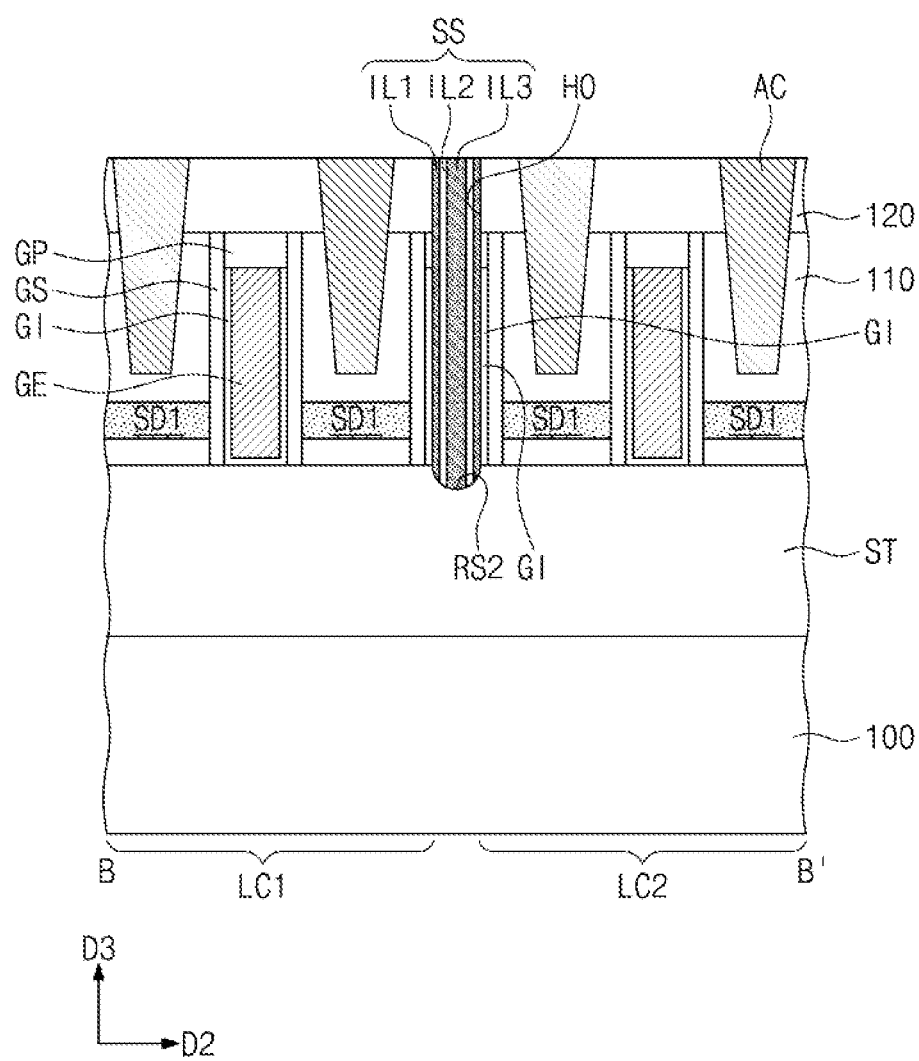

FIGS. 15A and 15B are cross-sectional views, which are taken along lines A-A' and B-B', respectively, of FIG. 1 and illustrate a semiconductor device according to an example embodiment of the present inventive concept. In the following description, an element previously described with reference to FIGS. 1 and 2A to 2E may be identified by the same reference number without repeating an overlapping description thereof.

The separation structure SS may be a multi-layered structure including a plurality of insulating layers. As an example, the separation structure SS may include first to third insulating layers IL1, IL2, and IL3. The first to third insulating layers IL1, IL2, and IL3 may extend vertically to fill the hole HO penetrating the second interlayer insulating layer 120 and the gate capping pattern GP. The gate dielectric pattern GI covering the gate spacer GS may not be etched during the formation of the hole HO. For example, the gate dielectric pattern GI may remain on the gate spacer GS, after the formation of the hole HO.

The first insulating layer IL1 may cover an inner sidewall of the hole HO. The second insulating layer IL2 and the third insulating layer IL3 may be provided on the first insulating layer IL1. The second insulating layer IL2 may be interposed between the first insulating layer IL1 and the third insulating layer IL3.

The first to third insulating layers IL1, IL2, and IL3 may be each independently formed of or include at least one of, for example, a silicon oxide ($SiO_2$) layer, a silicon nitride ($Si_3N_4$) layer, or a silicon oxynitride (SiON) layer. In an example embodiment of the present inventive concept, the first insulating layer IL1 may be a silicon nitride ($Si_3N_4$) layer, the second insulating layer IL2 may be a silicon oxide ($SiO_2$) layer, and the third insulating layer IL3 may be a silicon nitride ($Si_3N_4$) layer.

In an example embodiment of the present inventive concept, the first recess RS1 may be formed during the formation of the first to third insulating layers IL1, IL2, and IL3. In detail, a first anisotropic etching process may be performed to form a first preliminary recess in an upper portion of each of the first and second active patterns AP1 and AP2 exposed by the hole HO. The first insulating layer IL1 may be formed to partially fill the first preliminary recess. A second anisotropic etching process may be performed on the first insulating layer IL1 to form a second preliminary recess, which is deeper than the first preliminary recess. The second insulating layer IL2 may be formed to partially fill the second preliminary recess. The first and second insulating layers IL1 and IL2 may each be formed by a CVD process, an ALD process, or the like. A third anisotropic etching process may be performed on the second insulating layer IL2 to form the first recess RS1, which is deeper than the second preliminary recess. The third insulating layer IL3 may be formed to completely fill the first recess RS1 provided with the first and second insulating layers IL2 and IL3. The third insulating layer IL3 may be formed by a CVD process, an ALD process, a PVD process, or the like.

According to an example embodiment of the present inventive concept, a semiconductor device may include a gate dielectric pattern, which is provided on a side surface of a separation structure and is used to reduce a process defect. Thus, reliability of the semiconductor device may be enhanced.

While example embodiments of the present inventive concept have been particularly shown and described, it will be understood by one of ordinary skill in the art that variations in form and detail may be made therein without departing from the spirit and scope of the appended claims.

What is claimed is:

1. A semiconductor device, comprising:
a substrate including an active pattern, the active pattern including a plurality of source/drain patterns in an upper portion thereof;
a gate electrode extending in a first direction and crossing the active pattern which extends in a second direction;
a pair of first gate spacers on opposite sidewalls of the gate electrode, respectively;
a separation structure extending in the first direction through the active pattern, the separation structure bisecting the active pattern;
a pair of second gate spacers on opposite sidewalls of the separation structure, respectively;
a first gate dielectric pattern between the gate electrode and the pair of first gate spacers;
a first gate capping pattern covering a top surface of the gate electrode; and
a plurality of active contacts connected to the plurality of source/drain patterns, respectively,
wherein the separation structure has a round bottom surface that is lower than bottom surfaces of the plurality of source/drain patterns,
wherein the separation structure comprises a first insulating layer, a second insulating layer on the first insulating layer, and a third insulating layer on the second insulating layer,
wherein the first insulating layer extends from the pair of second gate spacers toward the round bottom surface, and
wherein a bottom surface of the second insulating layer and a bottom surface of the third insulating layer are in direct contact with the substrate.

2. The semiconductor device of claim 1, further comprising a second gate capping pattern between the pair of second gate spacers,
wherein the first insulating layer extends from the second gate capping pattern toward the round bottom surface.

3. The semiconductor device of claim 1, wherein the third insulating layer has a pillar shape disposed at a center of the separation structure, and
wherein the second insulating layer covers opposite sidewalls of the third insulating layer.

4. The semiconductor device of claim 1, wherein the pair of first gate spacers are spaced apart from each other by a first distance with the gate electrode interposed therebetween, and
wherein a width of the separation structure between the pair of second gate spacers is smaller than the first distance.

5. The semiconductor device of claim 1, wherein the plurality of active contacts are arranged at a first pitch along the second direction, and
wherein a width of the separation structure between the pair of second gate spacers is smaller than the first pitch.

6. The semiconductor device of claim 1, further comprising a second gate dielectric pattern between the separation structure and the pair of second gate spacers,
wherein the second gate dielectric pattern comprises a high-k dielectric material the same as that of the first gate dielectric pattern.

7. The semiconductor device of claim 1, wherein the second insulating layer includes an insulating material different from the first and third insulating layers.

8. The semiconductor device of claim 1, wherein the second insulating layer vertically extends between the first insulating layer and the third insulating layer.

9. The semiconductor device of claim 1, wherein a bottom surface of the first insulating layer, the bottom surface of the second insulating layer, and the bottom surface of the third insulating layer are located at different levels.

10. The semiconductor device of claim 9, wherein a top surface of the first insulating layer, a top surface of the second insulating layer, and a top surface of the third insulating layer are located at a same level.

11. The semiconductor device of claim 1, wherein the plurality of active contacts include a first active contact and a second active contact that are respectively adjacent to both sides of the separation structure,
wherein a first one of the pair of second gate spacers is between the first active contact and the separation structure, and
wherein a second one of the pair of second gate spacers is between the second active contact and the separation structure.

12. A semiconductor device, comprising:
a substrate including an active pattern, the active pattern including a plurality of source/drain patterns in an upper portion thereof;
a gate electrode extending in a first direction and crossing the active pattern which extends in a second direction;
a pair of first gate spacers on opposite sidewalls of the gate electrode, respectively;
a separation structure in a recess that is formed in the active pattern to bisect the active pattern and formed between a pair of the plurality of source/drain patterns adjacent to each other;
a pair of second gate spacers on opposite sidewalls of the separation structure, respectively;
a gate dielectric pattern between the gate electrode and the pair of first gate spacers;
a first gate capping pattern covering a top surface of the gate electrode; and
a plurality of active contacts connected to the plurality of source/drain patterns, respectively,
wherein the separation structure comprises a first insulating layer, a second insulating layer on the first insulating layer, and a third insulating layer on the second insulating layer,
wherein the first insulating layer extends from the pair of second gate spacers along a sidewall of the recess toward a bottom of the recess,
wherein a bottom surface of the first insulating layer, a bottom surface of the second insulating layer, and a bottom surface of the third insulating layer are located at different levels, and
wherein the bottom surface of the second insulating layer and the bottom surface of the third insulating layer are in direct contact with the substrate.

13. The semiconductor device of claim 12, wherein the bottom of the recess is round and lower than bottom surfaces of the plurality of source/drain patterns.

14. The semiconductor device of claim 12, further comprising a second gate capping pattern between the pair of second gate spacers, wherein the first insulating layer extends from the second gate capping pattern toward the bottom of the recess.

15. The semiconductor device of claim 12, wherein the third insulating layer has a pillar shape disposed at a center of the separation structure, and wherein the second insulating layer covers opposite sidewalls of the third insulating layer.

16. The semiconductor device of claim 12, wherein a top surface of the first insulating layer, a top surface of the second insulating layer, and a top surface of the third insulating layer are located at a same level.

17. A semiconductor device, comprising:

a substrate including an active pattern, the active pattern including a plurality of source/drain patterns in an upper portion thereof;

a gate electrode extending in a first direction and crossing the active pattern which extends in a second direction;

a pair of first gate spacers on opposite sidewalls of the gate electrode, respectively;

a separation structure in a recess that is formed in the active pattern to bisect the active pattern and formed between a pair of the plurality of source/drain patterns adjacent to each other;

a pair of second gate spacers on opposite sidewalls of the separation structure, respectively;

a gate dielectric pattern between the gate electrode and the pair of first gate spacers;

a gate capping pattern covering a top surface of the gate electrode; and a plurality of active contacts connected to the plurality of source/drain patterns, respectively, wherein the separation structure comprises a first insulating layer, a second insulating layer on the first insulating layer, and a third insulating layer on the second insulating layer, wherein opposite sidewalls of the recess are respectively aligned with sidewalls of the pair of second spacers that face each other, wherein the first insulating layer extends from a top surface of the separation structure along the sidewalls of the pair of second spacers and the opposite sidewalls of the recess toward a bottom of the recess, and wherein a bottom surface of the second insulating layer and a bottom surface of the third insulating layer are in direct contact with the substrate.

18. The semiconductor device of claim 17, wherein the bottom of the recess is round and lower than bottom surfaces of the plurality of source/drain patterns.

19. The semiconductor device of claim 17, wherein a bottom surface of the first insulating layer, the bottom surface of the second insulating layer, and the bottom surface of the third insulating layer are located at different levels, and wherein a top surface of the first insulating layer, a top surface of the second insulating layer, and a top surface of the third insulating layer are located at a same level.

20. The semiconductor device of claim 17, wherein the third insulating layer has a pillar shape disposed at a center of the separation structure, and wherein the second insulating layer covers opposite sidewalls of the third insulating layer.

* * * * *